US008237448B2

(12) United States Patent
Bertness (10) Patent No.: US 8,237,448 B2
(45) Date of Patent: Aug. 7, 2012

(54) BATTERY TESTERS WITH SECONDARY FUNCTIONALITY (75) Inventor: Kevin I. Bertness, Batavia, IL (US)

(73) Assignee: Midtronics, Inc., Willowbrook, IL (US)

( * ) Notice: Subject to any disclaimer, the term of this patent is extended or adjusted under 35 U.S.C. 154(b) by 862 days.

(21) Appl. No.: 12/168,264

(22) Filed: Jul. 7, 2008

(65) Prior Publication Data

US 2009/0085571 A1 Apr. 2, 2009

Related U.S. Application Data (60) Continuation of application No. 11/352,945, filed on Feb. 13, 2006, now Pat. No. 7,398,176, and a continuation-in-part of application No. 10/958,812, filed on Oct. 5, 2004, now Pat. No. 7,446,536, which is a continuation-in-part of application No. 10/460,749, filed on Jun. 12, 2003, now Pat. No. 6,967,484, which is a continuation-in-part of application No. 10/280,186, filed on Oct. 25, 2002, now Pat. No. 6,759,849, which is a continuation-in-part of application No. 09/816,768, filed on Mar. 23, 2001, now Pat. No. 6,586,941, said application No. 11/352,945 is a continuation-in-part of application No. 10/883,019, filed on Jul. 1, 2004, now Pat. No. 6,998,847, which is a division of application No. 10/280,186, filed on Oct. 25, 2002, now Pat. No. 6,759,849, which is a continuation-in-part of application No. 09/816,768, filed on Mar. 23, 2001, now Pat. No. 6,586,941.

(60) Provisional application No. 60/731,881, filed on Oct. 31, 2005, provisional application No. 60/192,222, filed on Mar. 27, 2000.

(51) Int. Cl.
G01N 27/416 (2006.01)
H02J 7/14 (2006.01)

(52) U.S. Cl. ........ 324/426; 324/425; 324/427; 324/428; 324/432; 320/104; 320/106; 320/134; 320/136

(58) Field of Classification Search .................. 324/426, 324/430, 425, 427, 428, 429, 431, 432, 433, 324/434; 320/104, 106, 134, 135, 136, 137, 320/138
See application file for complete search history.

(56) References Cited

U.S. PATENT DOCUMENTS 85,553 A 1/1869 Adams ............................ 33/472
(Continued)

FOREIGN PATENT DOCUMENTS

DE 29 26 716 B1 1/1981
(Continued)

OTHER PUBLICATIONS

"Electrochemical Impedance Spectroscopy in Battery Development and Testing", *Batteries International*, Apr. 1997, pp. 59 and 62-63.
(Continued)

*Primary Examiner* — Melissa Koval
*Assistant Examiner* — Alexis Boateng
(74) *Attorney, Agent, or Firm* — Westman, Champlin & Kelly, P.A.

(57) ABSTRACT

An electronic vehicle tester includes a battery tester configured to measure a parameter of a battery of a vehicle. A tire tester is configured to receive a parameter of a tire of the vehicle. A wireless receiver can be configured to receive pressure information from a transmitter associated with a tire of a vehicle.

41 Claims, 5 Drawing Sheets

U.S. PATENT DOCUMENTS

| | | | |
|---|---|---|---|
| 2,000,665 A | 5/1935 | Neal | 439/440 |
| 2,417,940 A | 3/1947 | Lehman | 200/61.25 |
| 2,514,745 A | 7/1950 | Dalzell | 324/115 |
| 2,727,221 A | 12/1955 | Springg | 340/447 |
| 3,267,452 A | 12/1963 | Wolf | 340/249 |
| 3,178,686 A | 4/1965 | Mills | 340/447 |
| 3,223,969 A | 12/1965 | Alexander | 340/447 |
| 3,356,936 A | 12/1967 | Smith | 324/429 |
| 3,562,634 A | 2/1971 | Latner | 324/427 |
| 3,593,099 A | 7/1971 | Scholl | 320/127 |
| 3,607,673 A | 9/1971 | Seyl | 324/425 |
| 3,652,341 A | 3/1972 | Halsall et al. | 29/623.2 |
| 3,676,770 A | 7/1972 | Sharaf et al. | 324/430 |
| 3,729,989 A | 5/1973 | Little | 73/862.192 |
| 3,750,011 A | 7/1973 | Kreps | 324/430 |
| 3,753,094 A | 8/1973 | Furuishi et al. | 324/430 |
| 3,776,177 A | 12/1973 | Bryant et al. | 116/311 |
| 3,796,124 A | 3/1974 | Crosa | 411/521 |
| 3,808,522 A | 4/1974 | Sharaf | 324/430 |
| 3,811,089 A | 5/1974 | Strzelewicz | 324/170 |
| 3,816,805 A | 6/1974 | Terry | 320/123 |
| 3,850,490 A | 11/1974 | Zehr | 439/822 |
| 3,873,911 A | 3/1975 | Champlin | 324/430 |
| 3,876,931 A | 4/1975 | Godshalk | 324/429 |
| 3,886,426 A | 5/1975 | Daggett | 320/117 |
| 3,886,443 A | 5/1975 | Miyakawa et al. | 324/426 |
| 3,889,248 A | 6/1975 | Ritter | 340/636.11 |
| 3,906,329 A | 9/1975 | Bader | 320/134 |
| 3,909,708 A | 9/1975 | Champlin | 324/431 |
| 3,936,744 A | 2/1976 | Perlmutter | 324/772 |
| 3,946,299 A | 3/1976 | Christianson et al. | 320/430 |
| 3,947,757 A | 3/1976 | Grube et al. | 324/416 |
| 3,969,667 A | 7/1976 | McWilliams | 324/427 |
| 3,979,664 A | 9/1976 | Harris | 324/397 |
| 3,984,762 A | 10/1976 | Dowgiallo, Jr. | 324/430 |
| 3,984,768 A | 10/1976 | Staples | 324/712 |
| 3,989,544 A | 11/1976 | Santo | 429/65 |
| 3,997,830 A | 12/1976 | Newell et al. | 320/102 |
| 4,008,619 A | 2/1977 | Alcaide et al. | 73/724 |
| 4,023,882 A | 5/1977 | Pettersson | 439/426 |
| 4,024,953 A | 5/1977 | Nailor, III | 206/344 |
| 4,047,091 A | 9/1977 | Hutchines et al. | 363/59 |
| 4,053,824 A | 10/1977 | Dupuis et al. | 324/434 |
| 4,056,764 A | 11/1977 | Endo et al. | 320/101 |
| 4,057,313 A | 11/1977 | Polizzano | 439/219 |
| 4,070,624 A | 1/1978 | Taylor | 324/772 |
| 4,086,531 A | 4/1978 | Bernier | 324/772 |
| 4,106,025 A | 8/1978 | Katz | 343/715 |
| 4,112,351 A | 9/1978 | Back et al. | 324/380 |
| 4,114,083 A | 9/1978 | Benham et al. | 340/636.13 |
| 4,126,874 A | 11/1978 | Suzuki et al. | 396/301 |
| 4,160,916 A | 7/1979 | Papasideris | 307/10.6 |
| 4,178,546 A | 12/1979 | Hulls et al. | 324/772 |
| 4,193,025 A | 3/1980 | Frailing et al. | 324/427 |
| 4,207,611 A | 6/1980 | Gordon | 701/33 |
| 4,217,645 A | 8/1980 | Barry et al. | 702/63 |
| 4,280,457 A | 7/1981 | Bloxham | 123/198 R |
| 4,297,639 A | 10/1981 | Branham | 324/429 |
| 4,307,342 A | 12/1981 | Peterson | 324/767 |
| 4,315,204 A | 2/1982 | Sievers et al. | 322/28 |
| 4,316,185 A | 2/1982 | Watrous et al. | 340/636.11 |
| 4,322,685 A | 3/1982 | Frailing et al. | 324/429 |
| 4,351,405 A | 9/1982 | Fields et al. | 180/65.2 |
| 4,352,067 A | 9/1982 | Ottone | 324/434 |
| 4,360,780 A | 11/1982 | Skutch, Jr. | 324/437 |
| 4,361,809 A | 11/1982 | Bil et al. | 324/426 |
| 4,363,407 A | 12/1982 | Buckler et al. | 209/3.3 |
| 4,369,404 A | 1/1983 | Korbell | 324/416 |
| 4,379,989 A | 4/1983 | Kurz et al. | 320/165 |
| 4,379,990 A | 4/1983 | Sievers et al. | 322/99 |
| 4,385,269 A | 5/1983 | Aspinwall et al. | 320/129 |
| 4,390,828 A | 6/1983 | Converse et al. | 320/153 |
| 4,392,101 A | 7/1983 | Saar et al. | 320/156 |
| 4,396,880 A | 8/1983 | Windebank | 320/156 |
| 4,408,157 A | 10/1983 | Beaubien | 324/712 |
| 4,412,169 A | 10/1983 | Dell'Orto | 320/123 |
| 4,423,378 A | 12/1983 | Marino et al. | 324/427 |
| 4,423,379 A | 12/1983 | Jacobs et al. | 324/429 |
| 4,424,491 A | 1/1984 | Bobbett et al. | 324/433 |
| 4,441,359 A | 4/1984 | Ezoe | 73/116.06 |
| 4,459,548 A | 7/1984 | Lentz et al. | 324/472 |
| 4,514,694 A | 4/1985 | Finger | 324/429 |
| 4,520,353 A | 5/1985 | McAuliffe | 340/636.16 |
| 4,521,498 A | 6/1985 | Juergens | 429/59 |
| 4,564,798 A | 1/1986 | Young | 320/103 |
| 4,620,767 A | 11/1986 | Woolf | 439/217 |
| 4,633,418 A | 12/1986 | Bishop | 702/63 |
| 4,637,359 A | 1/1987 | Cook | 123/179 |
| 4,659,977 A | 4/1987 | Kissel et al. | 320/150 |
| 4,663,580 A | 5/1987 | Wortman | 320/153 |
| 4,665,370 A | 5/1987 | Holland | 324/429 |
| 4,667,143 A | 5/1987 | Cooper et al. | 320/153 |
| 4,667,279 A | 5/1987 | Maier | 363/46 |
| 4,678,998 A | 7/1987 | Muramatsu | 324/427 |
| 4,679,000 A | 7/1987 | Clark | 324/428 |
| 4,680,528 A | 7/1987 | Mikami et al. | 320/165 |
| 4,686,442 A | 8/1987 | Radomski | 320/123 |
| 4,697,134 A | 9/1987 | Burkum et al. | 320/134 |
| 4,707,795 A | 11/1987 | Alber et al. | 702/63 |
| 4,709,202 A | 11/1987 | Koenck et al. | 320/112 |
| 4,710,861 A | 12/1987 | Kanner | 363/46 |
| 4,719,428 A | 1/1988 | Liebermann | 324/436 |
| 4,723,656 A | 2/1988 | Kiernan et al. | 206/705 |
| 4,743,855 A | 5/1988 | Randin et al. | 324/430 |
| 4,745,349 A | 5/1988 | Palanisamy et al. | 320/125 |
| 4,773,011 A | 9/1988 | VanHoose | 701/30 |
| 4,781,629 A | 11/1988 | Mize | 439/822 |
| 4,816,768 A | 3/1989 | Champlin | 324/428 |
| 4,820,966 A | 4/1989 | Fridman | 320/116 |
| 4,825,170 A | 4/1989 | Champlin | 324/436 |
| 4,847,547 A | 7/1989 | Eng, Jr. et al. | 320/153 |
| 4,849,700 A | 7/1989 | Morioka et al. | 324/427 |
| 4,874,679 A | 10/1989 | Miyagawa | 429/91 |
| 4,876,495 A | 10/1989 | Palanisamy et al. | 320/106 |
| 4,881,038 A | 11/1989 | Champlin | 324/426 |
| 4,885,523 A | 12/1989 | Koenck | 230/131 |
| 4,888,716 A | 12/1989 | Ueno | 702/63 |
| 4,901,007 A | 2/1990 | Sworm | 324/110 |
| 4,907,176 A | 3/1990 | Bahnick et al. | 364/551.01 |
| 4,912,416 A | 3/1990 | Champlin | 324/430 |
| 4,913,116 A | 4/1990 | Katogi et al. | 123/406.32 |
| 4,926,330 A | 5/1990 | Abe et al. | 701/33 |
| 4,929,931 A | 5/1990 | McCuen | 340/636.15 |
| 4,931,738 A | 6/1990 | MacIntyre et al. | 324/435 |
| 4,932,905 A | 6/1990 | Richards | 439/822 |
| 4,933,845 A | 6/1990 | Hayes | 710/104 |
| 4,934,957 A | 6/1990 | Bellusci | 439/504 |
| 4,937,528 A | 6/1990 | Palanisamy | 324/430 |
| 4,947,124 A | 8/1990 | Hauser | 324/430 |
| 4,949,046 A | 8/1990 | Seyfang | 324/427 |
| 4,956,597 A | 9/1990 | Heavey et al. | 320/129 |
| 4,965,738 A | 10/1990 | Bauer et al. | 320/136 |
| 4,968,941 A | 11/1990 | Rogers | 324/428 |
| 4,968,942 A | 11/1990 | Palanisamy | 324/430 |
| 4,969,834 A | 11/1990 | Johnson | 439/141 |
| 4,983,086 A | 1/1991 | Hatrock | 411/259 |
| 5,004,979 A | 4/1991 | Marino et al. | 324/160 |
| 5,030,916 A | 7/1991 | Bokitch | 324/503 |
| 5,032,825 A | 7/1991 | Kuznicki | 340/636.15 |
| 5,034,893 A | 7/1991 | Fisher | 701/99 |
| 5,037,778 A | 8/1991 | Stark et al. | 228/121 |
| 5,047,722 A | 9/1991 | Wurst et al. | 324/430 |
| 5,081,565 A | 1/1992 | Nabha et al. | 362/465 |
| 5,087,881 A | 2/1992 | Peacock | 324/378 |
| 5,095,223 A | 3/1992 | Thomas | 307/110 |
| 5,108,320 A | 4/1992 | Kimber | 439/883 |
| 5,109,213 A | 4/1992 | Williams | 340/447 |
| 5,126,675 A | 6/1992 | Yang | 324/435 |
| 5,130,658 A | 7/1992 | Bohmer | 324/435 |
| 5,140,269 A | 8/1992 | Champlin | 324/433 |
| 5,144,218 A | 9/1992 | Bosscha | 320/139 |
| 5,144,248 A | 9/1992 | Alexandres et al. | 324/428 |
| 5,159,272 A | 10/1992 | Rao et al. | 324/429 |
| 5,160,881 A | 11/1992 | Schramm et al. | 322/7 |
| 5,168,208 A | 12/1992 | Schultz et al. | 322/25 |
| 5,170,124 A | 12/1992 | Blair et al. | 324/434 |
| 5,179,335 A | 1/1993 | Nor | 320/159 |

| Patent | Date | Inventor | Class |
|---|---|---|---|
| 5,194,799 A | 3/1993 | Tomantschger | 320/103 |
| 5,204,611 A | 4/1993 | Nor et al. | 320/145 |
| 5,214,370 A | 5/1993 | Harm et al. | 320/152 |
| 5,214,385 A | 5/1993 | Gabriel et al. | 324/434 |
| 5,241,275 A | 8/1993 | Fang | 324/430 |
| 5,254,952 A | 10/1993 | Salley et al. | 324/429 |
| 5,266,880 A | 11/1993 | Newland | 320/125 |
| 5,278,759 A | 1/1994 | Berra et al. | 701/1 |
| 5,281,919 A | 1/1994 | Palanisamy | 324/427 |
| 5,281,920 A | 1/1994 | Wurst | 324/430 |
| 5,295,078 A | 3/1994 | Stich et al. | 700/297 |
| 5,298,797 A | 3/1994 | Redl | 327/387 |
| 5,300,874 A | 4/1994 | Shimamoto et al. | 320/106 |
| 5,302,902 A | 4/1994 | Groehl | 324/434 |
| 5,313,152 A | 5/1994 | Wozniak et al. | 320/118 |
| 5,315,287 A | 5/1994 | Sol | 340/455 |
| 5,321,626 A | 6/1994 | Palladino | 702/63 |
| 5,321,627 A | 6/1994 | Reher | 702/63 |
| 5,323,337 A | 6/1994 | Wilson et al. | 702/73 |
| 5,325,041 A | 6/1994 | Briggs | 320/149 |
| 5,331,268 A | 7/1994 | Patino et al. | 320/158 |
| 5,332,927 A | 7/1994 | Paul et al. | 307/66 |
| 5,336,993 A | 8/1994 | Thomas et al. | 324/158.1 |
| 5,338,515 A | 8/1994 | Dalla Betta et al. | 422/95 |
| 5,339,018 A | 8/1994 | Brokaw | 320/147 |
| 5,343,380 A | 8/1994 | Champlin | 363/46 |
| 5,347,163 A | 9/1994 | Yoshimura | 307/66 |
| 5,352,968 A | 10/1994 | Reni et al. | 320/136 |
| 5,357,519 A | 10/1994 | Martin et al. | 371/15.1 |
| 5,365,160 A | 11/1994 | Leppo et al. | 320/160 |
| 5,365,453 A | 11/1994 | Startup et al. | 702/36 |
| 5,369,364 A | 11/1994 | Renirie et al. | 324/430 |
| 5,381,096 A | 1/1995 | Hirzel | 324/427 |
| 5,387,871 A | 2/1995 | Tsai | 324/429 |
| 5,402,007 A | 3/1995 | Center et al. | 290/40 B |
| 5,410,754 A | 4/1995 | Klotzbach et al. | 370/466 |
| 5,412,308 A | 5/1995 | Brown | 323/267 |
| 5,412,323 A | 5/1995 | Kato et al. | 324/429 |
| 5,425,041 A | 6/1995 | Seko et al. | 372/45.01 |
| 5,426,371 A | 6/1995 | Salley et al. | 324/429 |
| 5,426,416 A | 6/1995 | Jefferies et al. | 340/664 |
| 5,430,645 A | 7/1995 | Keller | 364/424.01 |
| 5,432,025 A | 7/1995 | Cox | 29/65 |
| 5,432,426 A | 7/1995 | Yoshida | 320/160 |
| 5,434,495 A | 7/1995 | Toko | 320/135 |
| 5,435,185 A | 7/1995 | Eagan | 73/587 |
| 5,442,274 A | 8/1995 | Tamai | 320/146 |
| 5,445,026 A | 8/1995 | Eagan | 73/591 |
| 5,449,996 A | 9/1995 | Matsumoto et al. | 320/148 |
| 5,449,997 A | 9/1995 | Gilmore et al. | 320/148 |
| 5,451,881 A | 9/1995 | Finger | 324/433 |
| 5,453,027 A | 9/1995 | Buell et al. | 439/433 |
| 5,457,377 A | 10/1995 | Jonsson | 324/430 |
| 5,459,660 A | 10/1995 | Berra | 701/33 |
| 5,469,043 A | 11/1995 | Cherng et al. | 320/161 |
| 5,485,090 A | 1/1996 | Stephens | 324/433 |
| 5,488,300 A | 1/1996 | Jamieson | 324/433 |
| 5,504,674 A | 4/1996 | Chen et al. | 705/4 |
| 5,508,599 A | 4/1996 | Koenck | 320/138 |
| 5,519,383 A | 5/1996 | De La Rosa | 340/636.15 |
| 5,528,148 A | 6/1996 | Rogers | 320/137 |
| 5,537,967 A | 7/1996 | Tashiro et al. | 123/192.1 |
| 5,541,489 A | 7/1996 | Dunstan | 320/134 |
| 5,546,317 A | 8/1996 | Andrieu | 702/63 |
| 5,548,273 A | 8/1996 | Nicol et al. | 340/439 |
| 5,550,485 A | 8/1996 | Falk | 324/772 |
| 5,561,380 A | 10/1996 | Sway-Tin et al. | 324/509 |
| 5,562,501 A | 10/1996 | Kinoshita et al. | 439/852 |
| 5,563,496 A | 10/1996 | McClure | 320/128 |
| 5,572,136 A | 11/1996 | Champlin | 324/426 |
| 5,573,611 A | 11/1996 | Koch et al. | 152/152.1 |
| 5,574,355 A | 11/1996 | McShane et al. | 320/161 |
| 5,578,915 A | 11/1996 | Crouch, Jr. et al. | 324/428 |
| 5,583,416 A | 12/1996 | Klang | 320/160 |
| 5,585,416 A | 12/1996 | Audett et al. | 522/35 |
| 5,585,728 A | 12/1996 | Champlin | 324/427 |
| 5,589,757 A | 12/1996 | Klang | 320/160 |
| 5,592,093 A | 1/1997 | Klingbiel | 324/426 |
| 5,592,094 A | 1/1997 | Ichikawa | 324/427 |
| 5,596,260 A | 1/1997 | Moravec et al. | 320/135 |
| 5,596,261 A | 1/1997 | Suyama | 320/152 |
| 5,598,098 A | 1/1997 | Champlin | 324/430 |
| 5,602,462 A | 2/1997 | Stich et al. | 323/258 |
| 5,606,242 A | 2/1997 | Hull et al. | 320/106 |
| 5,614,788 A | 3/1997 | Mullins et al. | 315/82 |
| 5,621,298 A | 4/1997 | Harvey | 320/134 |
| 5,633,985 A | 5/1997 | Severson et al. | 704/267 |
| 5,637,978 A | 6/1997 | Kellett et al. | 320/104 |
| 5,642,031 A | 6/1997 | Brotto | 320/156 |
| 5,650,937 A | 7/1997 | Bounaga | 702/65 |
| 5,652,501 A | 7/1997 | McClure et al. | 340/636.15 |
| 5,653,659 A | 8/1997 | Kunibe et al. | 477/111 |
| 5,654,623 A | 8/1997 | Shiga et al. | 320/106 |
| 5,656,920 A | 8/1997 | Cherng et al. | 324/431 |
| 5,661,368 A | 8/1997 | Deol et al. | 315/82 |
| 5,666,040 A | 9/1997 | Bourbeau | 320/118 |
| 5,675,234 A | 10/1997 | Greene | 340/636.11 |
| 5,677,077 A | 10/1997 | Faulk | 429/90 |
| 5,684,678 A | 11/1997 | Barrett | 363/17 |
| 5,691,621 A * | 11/1997 | Phuoc et al. | 320/134 |
| 5,699,050 A | 12/1997 | Kanazawa | 340/636.13 |
| 5,701,089 A | 12/1997 | Perkins | 324/772 |
| 5,705,929 A | 1/1998 | Caravello et al. | 324/430 |
| 5,707,015 A | 1/1998 | Guthrie | 241/120 |
| 5,710,503 A | 1/1998 | Sideris et al. | 320/116 |
| 5,711,648 A | 1/1998 | Hammerslag | 414/800 |
| 5,712,795 A | 1/1998 | Layman et al. | 700/297 |
| 5,717,336 A | 2/1998 | Basell et al. | 324/430 |
| 5,717,937 A | 2/1998 | Fritz | 713/300 |
| 5,721,688 A | 2/1998 | Bramwell | 324/426 |
| 5,732,074 A | 3/1998 | Spaur et al. | 370/313 |
| 5,739,667 A | 4/1998 | Matsuda et al. | 320/128 |
| 5,744,962 A | 4/1998 | Alber et al. | 324/426 |
| 5,745,044 A | 4/1998 | Hyatt, Jr. et al. | 340/5.23 |
| 5,747,189 A | 5/1998 | Perkins | 429/91 |
| 5,747,909 A | 5/1998 | Syverson et al. | 310/156.56 |
| 5,747,967 A | 5/1998 | Muljadi et al. | 320/148 |
| 5,754,417 A | 5/1998 | Nicollini | 363/60 |
| 5,757,192 A | 5/1998 | McShane et al. | 324/427 |
| 5,760,587 A | 6/1998 | Harvey | 324/434 |
| 5,772,468 A | 6/1998 | Kowalski et al. | 439/506 |
| 5,773,962 A | 6/1998 | Nor | 20/134 |
| 5,773,978 A | 6/1998 | Becker | 324/430 |
| 5,778,326 A | 7/1998 | Moroto et al. | 701/22 |
| 5,780,974 A | 7/1998 | Pabla et al. | 315/82 |
| 5,780,980 A | 7/1998 | Naito | 318/139 |
| 5,789,899 A | 8/1998 | van Phuoc et al. | 320/112 |
| 5,793,359 A | 8/1998 | Ushikubo | 345/169 |
| 5,796,239 A | 8/1998 | van Phuoc et al. | 320/107 |
| 5,808,469 A | 9/1998 | Kopera | 324/434 |
| 5,811,979 A | 9/1998 | Rhein | 324/718 |
| 5,818,201 A | 10/1998 | Stockstad et al. | 320/119 |
| 5,818,234 A | 10/1998 | McKinnon | 324/433 |
| 5,820,407 A | 10/1998 | Morse et al. | 439/504 |
| 5,821,756 A | 10/1998 | McShane et al. | 324/430 |
| 5,821,757 A | 10/1998 | Alvarez et al. | 324/434 |
| 5,825,174 A | 10/1998 | Parker | 324/106 |
| 5,831,435 A | 11/1998 | Troy | 324/426 |
| 5,832,396 A | 11/1998 | Moroto et al. | 701/22 |
| 5,850,113 A | 12/1998 | Weimer et al. | 307/125 |
| 5,862,515 A | 1/1999 | Kobayashi et al. | 702/63 |
| 5,865,638 A | 2/1999 | Trafton | 439/288 |
| 5,871,858 A | 2/1999 | Thomsen et al. | 429/7 |
| 5,872,443 A | 2/1999 | Williamson | 320/160 |
| 5,872,453 A | 2/1999 | Shimoyama et al. | 324/431 |
| 5,883,306 A | 3/1999 | Hwang | 73/146.8 |
| 5,895,440 A | 4/1999 | Proctor et al. | 702/63 |
| 5,903,154 A | 5/1999 | Zhang et al. | 324/437 |
| 5,903,716 A | 5/1999 | Kimber et al. | 395/114 |
| 5,912,534 A | 6/1999 | Benedict | 315/82 |
| 5,914,605 A | 6/1999 | Bertness | 324/430 |
| 5,927,938 A | 7/1999 | Hammerslag | 414/809 |
| 5,929,609 A | 7/1999 | Joy et al. | 322/25 |
| 5,939,855 A | 8/1999 | Proctor et al. | 320/104 |
| 5,939,861 A | 8/1999 | Joko et al. | 320/122 |
| 5,945,829 A | 8/1999 | Bertness | 324/430 |
| 5,946,605 A | 8/1999 | Takahisa et al. | 455/68 |
| 5,950,144 A | 9/1999 | Hall et al. | 702/108 |

| Patent | Date | Inventor | Class |
|---|---|---|---|
| 5,951,229 A | 9/1999 | Hammerslag | 414/398 |
| 5,955,951 A | 9/1999 | Wischerop et al. | 340/572.8 |
| 5,961,561 A | 10/1999 | Wakefield, II | 701/29 |
| 5,961,604 A | 10/1999 | Anderson et al. | 709/229 |
| 5,969,625 A | 10/1999 | Russo | 340/636.19 |
| 5,973,598 A | 10/1999 | Beigel | 340/572.1 |
| 5,978,805 A | 11/1999 | Carson | 707/10 |
| 5,982,138 A | 11/1999 | Krieger | 320/105 |
| 5,990,664 A * | 11/1999 | Rahman | 320/136 |
| 6,002,238 A | 12/1999 | Champlin | 320/134 |
| 6,005,489 A | 12/1999 | Siegle et al. | 340/825.69 |
| 6,005,759 A | 12/1999 | Hart et al. | 361/66 |
| 6,008,652 A | 12/1999 | Theofanopoulos et al. | 324/434 |
| 6,009,369 A | 12/1999 | Boisvert et al. | 701/99 |
| 6,016,047 A | 1/2000 | Notten et al. | 320/137 |
| 6,031,354 A | 2/2000 | Wiley et al. | 320/116 |
| 6,031,368 A | 2/2000 | Klippel et al. | 324/133 |
| 6,037,745 A | 3/2000 | Koike et al. | 320/104 |
| 6,037,749 A | 3/2000 | Parsonage | 320/132 |
| 6,037,751 A | 3/2000 | Klang | 320/160 |
| 6,037,777 A | 3/2000 | Champlin | 324/430 |
| 6,037,778 A | 3/2000 | Makhija | 324/433 |
| 6,046,514 A | 4/2000 | Rouillard et al. | 307/77 |
| 6,051,976 A | 4/2000 | Bertness | 324/426 |
| 6,055,468 A | 4/2000 | Kaman et al. | 701/29 |
| 6,061,638 A | 5/2000 | Joyce | 702/63 |
| 6,064,372 A | 5/2000 | Kahkoska | 345/173 |
| 6,072,299 A | 6/2000 | Kurle et al. | 320/112 |
| 6,072,300 A | 6/2000 | Tsuji | 320/116 |
| 6,075,339 A | 6/2000 | Reipur et al. | 320/110 |
| 6,081,098 A | 6/2000 | Bertness et al. | 320/134 |
| 6,081,109 A | 6/2000 | Seymour et al. | 324/127 |
| 6,087,815 A | 7/2000 | Pfeifer et al. | 323/282 |
| 6,091,238 A | 7/2000 | McDermott | 324/207.2 |
| 6,091,245 A | 7/2000 | Bertness | 324/426 |
| 6,094,033 A | 7/2000 | Ding et al. | 320/132 |
| 6,097,193 A | 8/2000 | Bramwell | 324/429 |
| 6,100,670 A | 8/2000 | Levesque | 320/150 |
| 6,100,815 A * | 8/2000 | Pailthorp | 324/754.07 |
| 6,104,167 A | 8/2000 | Bertness et al. | 320/132 |
| 6,113,262 A | 9/2000 | Purola et al. | 374/45 |
| 6,114,834 A | 9/2000 | Parise | 320/109 |
| 6,136,914 A | 10/2000 | Hergenrother et al. | 524/495 |
| 6,137,269 A | 10/2000 | Champlin | 320/150 |
| 6,140,797 A | 10/2000 | Dunn | 320/105 |
| 6,144,185 A | 11/2000 | Dougherty et al. | 320/132 |
| 6,147,598 A | 11/2000 | Murphy et al. | 340/426.19 |
| 6,150,793 A | 11/2000 | Lesesky et al. | 320/104 |
| 6,158,000 A | 12/2000 | Collins | 713/1 |
| 6,161,640 A | 12/2000 | Yamaguchi | 180/65.8 |
| 6,163,156 A | 12/2000 | Bertness | 324/426 |
| 6,164,063 A | 12/2000 | Mendler | 60/274 |
| 6,167,349 A | 12/2000 | Alvarez | 702/63 |
| 6,172,483 B1 | 1/2001 | Champlin | 320/134 |
| 6,172,505 B1 | 1/2001 | Bertness | 324/430 |
| 6,177,737 B1 | 1/2001 | Palfey et al. | 307/64 |
| 6,181,545 B1 | 1/2001 | Amatucci et al. | 361/502 |
| 6,184,656 B1 | 2/2001 | Karunasiri et al. | 320/119 |
| 6,191,557 B1 * | 2/2001 | Gray et al. | 320/132 |
| 6,211,651 B1 | 4/2001 | Nemoto | 320/133 |
| 6,215,275 B1 | 4/2001 | Bean | 320/106 |
| 6,218,805 B1 | 4/2001 | Melcher | 320/105 |
| 6,218,936 B1 | 4/2001 | Imao | 340/447 |
| 6,222,342 B1 | 4/2001 | Eggert et al. | 320/105 |
| 6,222,369 B1 | 4/2001 | Champlin | 324/430 |
| D442,503 S | 5/2001 | Lundbeck et al. | D10/77 |
| 6,225,808 B1 | 5/2001 | Varghese et al. | 324/426 |
| 6,236,186 B1 | 5/2001 | Helton et al. | 320/106 |
| 6,236,332 B1 | 5/2001 | Conkright et al. | 340/3.1 |
| 6,236,949 B1 | 5/2001 | Hart | 702/64 |
| 6,238,253 B1 | 5/2001 | Qualls | 439/759 |
| 6,242,887 B1 | 6/2001 | Burke | 320/104 |
| 6,249,124 B1 | 6/2001 | Bertness | 324/426 |
| 6,250,973 B1 | 6/2001 | Lowery et al. | 439/763 |
| 6,254,438 B1 | 7/2001 | Gaunt | 439/755 |
| 6,259,170 B1 | 7/2001 | Limoge et al. | 307/10.8 |
| 6,259,254 B1 | 7/2001 | Klang | 324/427 |
| 6,262,563 B1 | 7/2001 | Champlin | 320/134 |
| 6,263,268 B1 | 7/2001 | Nathanson | 701/29 |
| 6,271,643 B1 | 8/2001 | Becker et al. | 320/112 |
| 6,271,748 B1 | 8/2001 | Derbyshire et al. | 340/442 |
| 6,275,008 B1 | 8/2001 | Arai et al. | 320/132 |
| 6,285,191 B1 | 9/2001 | Gollomp et al. | 324/427 |
| 6,294,896 B1 | 9/2001 | Champlin | 320/134 |
| 6,294,897 B1 | 9/2001 | Champlin | 320/153 |
| 6,304,087 B1 | 10/2001 | Bertness | 324/426 |
| 6,307,349 B1 | 10/2001 | Koenck et al. | 320/112 |
| 6,310,481 B2 | 10/2001 | Bertness | 324/430 |
| 6,313,607 B1 | 11/2001 | Champlin | 320/132 |
| 6,313,608 B1 | 11/2001 | Varghese et al. | 320/132 |
| 6,316,914 B1 | 11/2001 | Bertness | 320/134 |
| 6,320,351 B1 * | 11/2001 | Ng et al. | 320/104 |
| 6,323,650 B1 | 11/2001 | Bertness et al. | 324/426 |
| 6,324,042 B1 | 11/2001 | Andrews | 361/93.2 |
| 6,329,793 B1 | 12/2001 | Bertness et al. | 320/132 |
| 6,331,762 B1 | 12/2001 | Bertness | 320/134 |
| 6,332,113 B1 | 12/2001 | Bertness | 702/63 |
| 6,346,795 B2 | 2/2002 | Haraguchi et al. | 320/136 |
| 6,347,958 B1 | 2/2002 | Tsai | 439/488 |
| 6,351,102 B1 | 2/2002 | Troy | 320/139 |
| 6,356,042 B1 | 3/2002 | Kahlon et al. | 318/138 |
| 6,356,083 B1 | 3/2002 | Ying | 324/426 |
| 6,359,441 B1 | 3/2002 | Bertness | 324/426 |
| 6,359,442 B1 | 3/2002 | Henningson et al. | 324/426 |
| 6,363,303 B1 | 3/2002 | Bertness | 701/29 |
| RE37,677 E | 4/2002 | Irie | 315/83 |
| 6,377,031 B1 | 4/2002 | Karuppana et al. | 323/220 |
| 6,384,608 B1 | 5/2002 | Namaky | 324/430 |
| 6,388,448 B1 | 5/2002 | Cervas | 324/426 |
| 6,392,414 B2 | 5/2002 | Bertness | 324/429 |
| 6,396,278 B1 | 5/2002 | Makhija | 324/402 |
| 6,407,554 B1 | 6/2002 | Godau et al. | 324/503 |
| 6,411,098 B1 | 6/2002 | Laletin | 324/436 |
| 6,417,669 B1 | 7/2002 | Champlin | 324/426 |
| 6,420,852 B1 | 7/2002 | Sato | 320/134 |
| 6,424,157 B1 | 7/2002 | Gollomp et al. | 324/430 |
| 6,424,158 B2 | 7/2002 | Klang | 324/433 |
| 6,437,957 B1 | 8/2002 | Karuppana et al. | 361/78 |
| 6,441,585 B1 | 8/2002 | Bertness | 320/132 |
| 6,445,158 B1 | 9/2002 | Bertness et al. | 320/104 |
| 6,449,726 B1 | 9/2002 | Smith | 713/340 |
| 6,456,036 B1 | 9/2002 | Thandiwe | 320/106 |
| 6,456,045 B1 | 9/2002 | Troy et al. | 320/139 |
| 6,465,908 B1 | 10/2002 | Karuppana et al. | 307/31 |
| 6,466,025 B1 | 10/2002 | Klang | 324/429 |
| 6,466,026 B1 | 10/2002 | Champlin | 324/430 |
| 6,469,511 B1 | 10/2002 | Vonderhaar et al. | 324/425 |
| 6,477,478 B1 | 11/2002 | Jones et al. | 702/102 |
| 6,495,990 B2 | 12/2002 | Champlin | 320/132 |
| 6,497,209 B1 | 12/2002 | Karuppana et al. | 123/179.3 |
| 6,500,025 B1 | 12/2002 | Moenkhaus et al. | 439/502 |
| 6,505,507 B1 | 1/2003 | Imao | 73/146.5 |
| 6,507,196 B2 | 1/2003 | Thomsen et al. | 324/436 |
| 6,526,361 B1 | 2/2003 | Jones et al. | 702/63 |
| 6,529,723 B1 | 3/2003 | Bentley | 455/405 |
| 6,531,848 B1 | 3/2003 | Chitsazan et al. | 320/153 |
| 6,532,425 B1 | 3/2003 | Boost et al. | 702/63 |
| 6,534,992 B2 | 3/2003 | Meissner et al. | 324/426 |
| 6,534,993 B2 | 3/2003 | Bertness | 324/433 |
| 6,536,536 B1 | 3/2003 | Gass et al. | 173/2 |
| 6,544,078 B2 | 4/2003 | Palmisano et al. | 439/762 |
| 6,545,599 B2 | 4/2003 | Derbyshire et al. | 340/442 |
| 6,556,019 B2 | 4/2003 | Bertness | 324/426 |
| 6,566,883 B1 | 5/2003 | Vonderhaar et al. | 324/426 |
| 6,570,385 B1 * | 5/2003 | Roberts et al. | 324/378 |
| 6,577,107 B2 | 6/2003 | Kechmire | 320/139 |
| 6,586,941 B2 | 7/2003 | Bertness et al. | 324/426 |
| 6,597,150 B1 | 7/2003 | Bertness et al. | 320/104 |
| 6,599,243 B2 | 7/2003 | Woltermann et al. | 600/300 |
| 6,600,815 B1 | 7/2003 | Walding | 379/93.07 |
| 6,611,740 B2 | 8/2003 | Lowrey et al. | 701/29 |
| 6,614,349 B1 | 9/2003 | Proctor et al. | 340/572.1 |
| 6,618,644 B2 | 9/2003 | Bean | 700/231 |
| 6,621,272 B2 | 9/2003 | Champlin | 324/426 |
| 6,623,314 B1 | 9/2003 | Cox et al. | 439/759 |
| 6,624,635 B1 | 9/2003 | Lui | 24/426 |
| 6,628,011 B2 | 9/2003 | Droppo et al. | 307/43 |
| 6,629,054 B2 | 9/2003 | Makhija et al. | 702/113 |

| Patent No. | Date | Inventor | Class |
|---|---|---|---|
| 6,633,165 B2 | 10/2003 | Bertness | 324/426 |
| 6,635,974 B1 | 10/2003 | Karuppana et al. | 307/140 |
| 6,667,624 B1 | 12/2003 | Raichle et al. | 324/522 |
| 6,679,212 B2 | 1/2004 | Kelling | 123/179.28 |
| 6,686,542 B2 | 2/2004 | Zhang | 174/74 |
| 6,696,819 B2 | 2/2004 | Bertness | 320/134 |
| 6,707,303 B2 | 3/2004 | Bertness et al. | 324/426 |
| 6,736,941 B2 | 5/2004 | Oku et al. | 203/68 |
| 6,737,831 B2 | 5/2004 | Champlin | 320/132 |
| 6,738,697 B2 | 5/2004 | Breed | 701/29 |
| 6,740,990 B2 | 5/2004 | Tozuka et al. | 307/9.1 |
| 6,744,149 B1 | 6/2004 | Karuppana et al. | 307/31 |
| 6,745,153 B2 | 6/2004 | White et al. | 702/184 |
| 6,759,849 B2 | 7/2004 | Bertness | 324/426 |
| 6,771,073 B2 | 8/2004 | Henningson et al. | 324/426 |
| 6,777,945 B2 | 8/2004 | Roberts et al. | 324/426 |
| 6,781,382 B2 | 8/2004 | Johnson | 324/426 |
| 6,784,635 B2 | 8/2004 | Larson | 320/104 |
| 6,784,637 B2 | 8/2004 | Raichle et al. | 320/107 |
| 6,788,025 B2 | 9/2004 | Bertness et al. | 320/104 |
| 6,795,782 B2 | 9/2004 | Bertness et al. | 702/63 |
| 6,796,841 B1 | 9/2004 | Cheng et al. | 439/620.3 |
| 6,805,090 B2 | 10/2004 | Bertness et al. | 123/198 |
| 6,806,716 B2 | 10/2004 | Bertness et al. | 324/426 |
| 6,825,669 B2 | 11/2004 | Raichle et al. | 324/426 |
| 6,842,707 B2 | 1/2005 | Raichle et al. | 702/62 |
| 6,845,279 B1 | 1/2005 | Gilmore et al. | 700/115 |
| 6,850,037 B2 | 2/2005 | Bertness | 320/132 |
| 6,856,972 B1 | 2/2005 | Yun et al. | 705/36 R |
| 6,871,151 B2 | 3/2005 | Bertness | 702/63 |
| 6,885,195 B2 | 4/2005 | Bertness | 324/426 |
| 6,888,468 B2 | 5/2005 | Bertness | 340/636.15 |
| 6,891,378 B2 | 5/2005 | Bertness et al. | 324/426 |
| 6,904,796 B2 | 6/2005 | Pacsai et al. | 73/146.8 |
| 6,906,522 B2 | 6/2005 | Bertness et al. | 324/426 |
| 6,906,523 B2 | 6/2005 | Bertness et al. | 324/426 |
| 6,906,624 B2 | 6/2005 | McClelland et al. | 340/442 |
| 6,909,287 B2 | 6/2005 | Bertness | 324/427 |
| 6,909,356 B2 | 6/2005 | Brown et al. | 340/3.2 |
| 6,913,483 B2 | 7/2005 | Restaino et al. | 439/504 |
| 6,914,413 B2 | 7/2005 | Bertness et al. | 320/104 |
| 6,919,725 B2 | 7/2005 | Bertness et al. | 324/433 |
| 6,930,485 B2 | 8/2005 | Bertness et al. | 324/426 |
| 6,933,727 B2 | 8/2005 | Bertness et al. | 324/426 |
| 6,941,234 B2 | 9/2005 | Bertness et al. | 702/63 |
| 6,967,484 B2 | 11/2005 | Bertness | 324/426 |
| 6,972,662 B1 | 12/2005 | Ohkawa et al. | 340/10.1 |
| 6,998,847 B2 | 2/2006 | Bertness et al. | 324/426 |
| 7,003,410 B2 | 2/2006 | Bertness et al. | 702/63 |
| 7,003,411 B2 | 2/2006 | Bertness | 702/63 |
| 7,012,433 B2 | 3/2006 | Smith et al. | 324/426 |
| 7,029,338 B1 | 4/2006 | Orange et al. | 439/755 |
| 7,034,541 B2 | 4/2006 | Bertness et al. | 324/426 |
| 7,058,525 B2 | 6/2006 | Bertness et al. | 702/63 |
| 7,081,755 B2 | 7/2006 | Klang et al. | 324/426 |
| 7,089,127 B2 | 8/2006 | Thibedeau et al. | 702/63 |
| 7,098,666 B2 | 8/2006 | Patino | 324/426 |
| 7,102,556 B2 | 9/2006 | White | 341/141 |
| 7,106,070 B2 | 9/2006 | Bertness et al. | 324/538 |
| 7,116,109 B2 | 10/2006 | Klang | 324/426 |
| 7,119,686 B2 | 10/2006 | Bertness et al. | 340/572.1 |
| 7,120,488 B2 | 10/2006 | Nova et al. | 600/2 |
| 7,126,341 B2 | 10/2006 | Bertness et al. | 324/426 |
| 7,129,706 B2 | 10/2006 | Kalley | 324/426 |
| 7,154,276 B2 | 12/2006 | Bertness | 324/503 |
| 7,177,925 B2 | 2/2007 | Carcido et al. | 709/223 |
| 7,182,147 B2 | 2/2007 | Cutler et al. | 173/1 |
| 7,184,905 B2 | 2/2007 | Stefan | 702/63 |
| 7,200,424 B2 | 4/2007 | Tischer et al. | 455/567 |
| 7,208,914 B2 | 4/2007 | Klang | 320/132 |
| 7,209,850 B2 | 4/2007 | Brott et al. | 324/426 |
| 7,209,860 B2 | 4/2007 | Trsar et al. | 702/63 |
| 7,212,887 B2 | 5/2007 | Shah et al | 700/276 |
| 7,219,023 B2 | 5/2007 | Banke et al. | 702/58 |
| 7,233,128 B2 | 6/2007 | Brost et al. | 320/132 |
| 7,235,977 B2 | 6/2007 | Koran et al. | 324/426 |
| 7,246,015 B2 | 7/2007 | Bertness et al. | 702/63 |
| 7,272,519 B2 | 9/2007 | Lesesky et al. | 702/63 |
| 7,287,001 B1 | 10/2007 | Falls et al. | 705/22 |
| 7,295,936 B2 | 11/2007 | Bertness et al. | 702/63 |
| 7,319,304 B2 | 1/2008 | Veloo et al. | 320/134 |
| 7,339,477 B2 | 3/2008 | Puzio et al. | 340/572.1 |
| 7,363,175 B2 | 4/2008 | Bertness et al. | 702/63 |
| 7,398,176 B2 | 7/2008 | Bertness | 702/140 |
| 7,408,358 B2 | 8/2008 | Knopf | 324/426 |
| 7,425,833 B2 | 9/2008 | Bertness et al. | 324/426 |
| 7,446,536 B2 | 11/2008 | Bertness | 324/426 |
| 7,453,238 B2 | 11/2008 | Melichar | 320/132 |
| 7,479,763 B2 | 1/2009 | Bertness | 320/134 |
| 7,498,767 B2 | 3/2009 | Brown et al. | 320/107 |
| 7,501,795 B2 | 3/2009 | Bertness et al. | 320/134 |
| 7,505,856 B2 | 3/2009 | Restaino et al. | 702/63 |
| 7,545,146 B2 | 6/2009 | Klang et al. | 324/426 |
| 7,557,586 B1 | 7/2009 | Vonderhaar et al. | 324/437 |
| 7,595,643 B2 | 9/2009 | Klang | 324/426 |
| 7,598,699 B2 | 10/2009 | Restaino et al. | 320/105 |
| 7,598,743 B2 | 10/2009 | Bertness | 324/426 |
| 7,598,744 B2 | 10/2009 | Bertness et al. | 324/426 |
| 7,619,417 B2 | 11/2009 | Klang | 324/427 |
| 7,642,786 B2 | 1/2010 | Philbrook | 324/426 |
| 7,642,787 B2 | 1/2010 | Bertness et al. | 324/426 |
| 7,656,162 B2 | 2/2010 | Vonderhaar et al. | 324/426 |
| 7,657,386 B2 * | 2/2010 | Thibedeau et al. | 702/63 |
| 7,679,325 B2 | 3/2010 | Seo | 20/116 |
| 7,688,074 B2 | 3/2010 | Cox et al. | 324/426 |
| 7,698,179 B2 | 4/2010 | Leung et al. | 705/28 |
| 7,705,602 B2 | 4/2010 | Bertness | 324/426 |
| 7,706,991 B2 | 4/2010 | Bertness et al. | 702/63 |
| 7,710,119 B2 | 5/2010 | Bertness | 324/426 |
| 7,723,993 B2 | 5/2010 | Klang | 324/431 |
| 7,728,597 B2 | 6/2010 | Bertness | 324/426 |
| 7,772,850 B2 | 8/2010 | Bertness | 324/426 |
| 7,774,151 B2 | 8/2010 | Bertness | 702/63 |
| 7,777,612 B2 | 8/2010 | Sampson et al. | 340/426.1 |
| 7,791,348 B2 | 9/2010 | Brown et al. | 324/426 |
| 7,808,375 B2 | 10/2010 | Bertness et al. | 340/455 |
| 7,883,002 B2 | 2/2011 | Jin et al. | 235/376 |
| 7,924,015 B2 | 4/2011 | Bertness | 324/426 |
| 2001/0035737 A1 | 11/2001 | Nakanishi et al. | 320/122 |
| 2002/0004694 A1 | 1/2002 | McLeod | 701/29 |
| 2002/0010558 A1 | 1/2002 | Bertness et al. | 702/63 |
| 2002/0021135 A1 | 2/2002 | Li et al. | 324/677 |
| 2002/0041175 A1 | 4/2002 | Lauper et al. | 320/106 |
| 2002/0044050 A1 | 4/2002 | Derbyshire et al. | 340/442 |
| 2002/0074398 A1 | 6/2002 | Lancos et al. | 235/382 |
| 2002/0118111 A1 | 8/2002 | Brown et al. | 340/573.1 |
| 2002/0171428 A1 | 11/2002 | Bertness | 702/63 |
| 2002/0176010 A1 | 11/2002 | Wallach et al. | 348/362 |
| 2003/0009270 A1 | 1/2003 | Breed | 701/29 |
| 2003/0025481 A1 | 2/2003 | Bertness | 324/427 |
| 2003/0036909 A1 | 2/2003 | Kato | 704/275 |
| 2003/0040873 A1 | 2/2003 | Lesesky et al. | 702/57 |
| 2003/0078743 A1 | 4/2003 | Bertness et al. | 702/63 |
| 2003/0088375 A1 | 5/2003 | Bertness et al. | 702/63 |
| 2003/0128036 A1 | 7/2003 | Henningson et al. | 324/426 |
| 2003/0169018 A1 | 9/2003 | Berels et al. | 320/132 |
| 2003/0169019 A1 | 9/2003 | Oosaki | 320/132 |
| 2003/0184262 A1 | 10/2003 | Makhija | 320/156 |
| 2003/0184306 A1 | 10/2003 | Bertness et al. | 324/426 |
| 2003/0187556 A1 | 10/2003 | Suzuki | 701/29 |
| 2003/0194672 A1 | 10/2003 | Roberts et al. | 431/196 |
| 2003/0197512 A1 | 10/2003 | Miller et al. | 324/426 |
| 2003/0212311 A1 | 11/2003 | Nova et al. | 600/300 |
| 2003/0214395 A1 | 11/2003 | Flowerday et al. | 340/445 |
| 2004/0000590 A1 | 1/2004 | Raichle et al. | 235/462.01 |
| 2004/0000891 A1 | 1/2004 | Raichle et al. | 320/107 |
| 2004/0000893 A1 | 1/2004 | Raichle et al. | 320/135 |
| 2004/0002824 A1 | 1/2004 | Raichle et al. | 702/63 |
| 2004/0002825 A1 | 1/2004 | Raichle et al. | 702/63 |
| 2004/0002836 A1 | 1/2004 | Raichle et al. | 702/188 |
| 2004/0032264 A1 | 2/2004 | Schoch | 324/426 |
| 2004/0044452 A1 | 3/2004 | Bauer et al. | 703/33 |
| 2004/0049361 A1 | 3/2004 | Hamdan et al. | 702/115 |
| 2004/0051533 A1 | 3/2004 | Namaky | 324/426 |
| 2004/0054503 A1 * | 3/2004 | Namaky | 702/183 |
| 2004/0113588 A1 | 6/2004 | Mikuriya et al. | 320/128 |
| 2004/0145342 A1 | 7/2004 | Lyon | 320/108 |
| 2004/0164706 A1 | 8/2004 | Osborne | 320/116 |

| | | | | |
|---|---|---|---|---|
| 2004/0178185 A1 | 9/2004 | Yoshikawa et al. ............ 219/270 | | |
| 2004/0199343 A1 | 10/2004 | Cardinal et al. ................ 702/63 | | |
| 2004/0227523 A1 | 11/2004 | Namaky ........................ 324/537 | | |
| 2004/0239332 A1 | 12/2004 | Mackel et al. ................ 324/426 | | |
| 2004/0251876 A1 | 12/2004 | Bertness ........................ 320/136 | | |
| 2005/0007068 A1 | 1/2005 | Johnson et al. ............... 320/110 | | |
| 2005/0017726 A1* | 1/2005 | Koran et al. ................... 324/433 | | |
| 2005/0021294 A1 | 1/2005 | Trsar et al. ................... 702/183 | | |
| 2005/0025299 A1 | 2/2005 | Tischer et al. ................ 379/199 | | |
| 2005/0043868 A1 | 2/2005 | Mitcham ........................ 701/29 | | |
| 2005/0057256 A1 | 3/2005 | Bertness ........................ 324/426 | | |
| 2005/0073314 A1 | 4/2005 | Bertness et al. ............... 324/433 | | |
| 2005/0102073 A1 | 5/2005 | Ingram ........................... 701/29 | | |
| 2005/0128083 A1 | 6/2005 | Puzio et al. ................. 340/572.1 | | |
| 2005/0159847 A1 | 7/2005 | Shah et al. .................... 700/276 | | |
| 2005/0168226 A1 | 8/2005 | Quint et al. ................... 324/426 | | |
| 2005/0173142 A1 | 8/2005 | Cutler et al. ................... 173/181 | | |
| 2005/0182536 A1 | 8/2005 | Doyle et al. ..................... 701/29 | | |
| 2005/0218902 A1 | 10/2005 | Restaino et al. .............. 324/433 | | |
| 2005/0254106 A9* | 11/2005 | Silverbrook et al. ......... 358/539 | | |
| 2005/0256617 A1 | 11/2005 | Cawthorne et al. ............. 701/22 | | |
| 2005/0258241 A1 | 11/2005 | McNutt et al. ................ 235/385 | | |
| 2006/0012330 A1 | 1/2006 | Okumura et al. .............. 320/103 | | |
| 2006/0030980 A1 | 2/2006 | St. Denis ........................ 701/29 | | |
| 2006/0089767 A1 | 4/2006 | Sowa ............................. 701/29 | | |
| 2006/0217914 A1 | 9/2006 | Bertness ........................ 702/113 | | |
| 2006/0282323 A1 | 12/2006 | Walker et al. ................... 705/14 | | |
| 2007/0024460 A1 | 2/2007 | Clark ............................ 340/663 | | |
| 2007/0026916 A1 | 2/2007 | Juds et al. .......................... 463/1 | | |
| 2007/0194791 A1 | 8/2007 | Huang .......................... 324/430 | | |
| 2008/0303528 A1* | 12/2008 | Kim .............................. 324/430 | | |
| 2008/0303529 A1 | 12/2008 | Nakamura et al. ............ 324/433 | | |
| 2009/0247020 A1 | 10/2009 | Gathman et al. .............. 439/759 | | |
| 2010/0145780 A1 | 6/2010 | Nishikawa et al. .......... 705/14.1 | | |
| 2010/0314950 A1 | 12/2010 | Rutkowski et al. ........... 307/125 | | |
| 2011/0004427 A1 | 1/2011 | Gorbold et al. ................. 702/63 | | |

FOREIGN PATENT DOCUMENTS

| | | |
|---|---|---|
| DE | 19638324 | 9/1996 |
| EP | 0 022 450 A1 | 1/1981 |
| EP | 0 637 754 A1 | 2/1995 |
| EP | 0 772 056 A1 | 5/1997 |
| EP | 0 982 159 A2 | 3/2000 |
| FR | 2 749 397 | 12/1997 |
| GB | 2 029 586 | 3/1980 |
| GB | 2 088 159 A | 6/1982 |
| GB | 2 246 916 A | 10/1990 |
| GB | 2 275 783 A | 7/1994 |
| GB | 2 387 235 A | 10/2003 |
| JP | 59-17892 | 1/1984 |
| JP | 59-17893 | 1/1984 |
| JP | 59-17894 | 1/1984 |
| JP | 59017894 | 1/1984 |
| JP | 59215674 | 12/1984 |
| JP | 60225078 | 11/1985 |
| JP | 62-180284 | 8/1987 |
| JP | 63027776 | 2/1988 |
| JP | 03274479 | 12/1991 |
| JP | 03282276 | 12/1991 |
| JP | 4-8636 | 1/1992 |
| JP | 04095788 | 3/1992 |
| JP | 04131779 | 5/1992 |
| JP | 04372536 | 12/1992 |
| JP | 05211724 A | 8/1993 |
| JP | 5216550 | 8/1993 |
| JP | 7-128414 | 5/1995 |
| JP | 09061505 | 3/1997 |
| JP | 10056744 | 2/1998 |
| JP | 10232273 | 9/1998 |
| JP | 11103503 A | 4/1999 |
| JP | 11-150809 | 6/1999 |
| RU | 2089015 C1 | 8/1997 |
| WO | WO 93/22666 | 11/1993 |
| WO | WO 94/05069 | 3/1994 |
| WO | WO 96/01456 | 1/1996 |
| WO | WO 96/06747 | 3/1996 |
| WO | WO 96/28846 | 9/1996 |
| WO | WO 97/01103 | 1/1997 |
| WO | WO 97/44652 | 11/1997 |
| WO | WO 98/04910 | 2/1998 |
| WO | WO 98/58270 | 12/1998 |
| WO | WO 99/23738 | 5/1999 |
| WO | WO 99/56121 | 11/1999 |
| WO | WO 00/16083 | 3/2000 |
| WO | WO 00/62049 | 10/2000 |
| WO | WO 00/67359 | 11/2000 |
| WO | WO 01/59443 | 2/2001 |
| WO | WO 01/16614 | 3/2001 |
| WO | WO 01/16615 | 3/2001 |
| WO | WO 01/51947 | 7/2001 |
| WO | WO 03/047064 A3 | 6/2003 |
| WO | WO 03/076960 A1 | 9/2003 |
| WO | WO 2004/047215 A1 | 6/2004 |

OTHER PUBLICATIONS

"Battery Impedance", by E. Willihnganz et al., *Electrical Engineering*, Sep. 1959, pp. 922-925.

"Determining the End of Battery Life", by S. DeBardelaben, *IEEE*, 1986, pp. 365-368.

"A Look at the Impedance of a Cell", by S. Debardelaben, *IEEE*, 1988, pp. 394-397.

"The Impedance of Electrical Storage Cells", by N.A. Hampson et al., *Journal of Applied Electrochemistry*, 1980, pp. 3-11.

"A Package for Impedance/Admittance Data Analysis", by B. Boukamp, *Solid State Ionics*, 1986, pp. 136-140.

"Precision of Impedance Spectroscopy Estimates of Bulk, Reaction Rate, and Diffusion Parameters", by J. Macdonald et al., *J. Electroanal, Chem.*, 1991, pp. 1-11.

Internal Resistance: Harbinger of Capacity Loss in Starved Electrolyte Sealed Lead Acid Batteries, by Vaccaro, F.J. et al., *AT&T Bell Laboratories*, 1987 IEEE, Ch. 2477, pp. 128,131.

IEEE Recommended Practice for Maintenance, Testings, and Replacement of Large Lead Storage Batteries for Generating Stations and Substations, *The Institute of Electrical and Electronics Engineers, Inc., ANSI/IEEE Std.* 450-1987, Mar. 9, 1987, pp. 7-15.

"Field and Laboratory Studies to Assess the State of Health of Valve-Regulated Lead Acid Batteries: Part I Conductance/Capacity Correlation Studies", by D. Feder et al., *IEEE*, Aug. 1992, pp. 218-233.

"JIS Japanese Industrial Standard-Lead Acid Batteries for Automobiles", *Japanese Standards Association UDC*, 621.355.2:629.113. 006, Nov. 1995.

"Performance of Dry Cells", by C. Hambuechen, Preprint of *Am. Electrochem. Soc.*, Apr. 18-20, 1912, paper No. 19, pp. 1-5.

"A Bridge for Measuring Storage Battery Resistance", by E. Willihncanz, *The Electrochemical Society*, preprint 79-20, Apr. 1941, pp. 253-258.

National Semiconductor Corporation, "High Q Notch Filter", Mar. 1969, Linear Brief 5, Mar. 1969.

Burr-Brown Corporation, "Design A 60 Hz Notch Filter with the UAF42", Jan. 1994, AB-071, 1994.

National Semiconductor Corporation, "LMF90-4$^{th}$-Order Elliptic Notch Filter", Dec. 1994, RRD-B30M115, Dec. 1994.

"Alligator Clips with Wire Penetrators" *J.S. Popper, Inc.* product information, downloaded from http://www.jspopper.com/, undated.

"#12: LM78S40 Simple Switcher DC to DC Converter", *ITM e-Catalog*, downloaded from http://www.pcbcafe.com, undated.

"Simple DC-DC Converts Allows Use of Single Battery", *Electronix Express*, downloaded from http://www.elexp.com/t_dc-dc.htm, undated.

"DC-DC Converter Basics", *Power Designers*, downloaded from http://www.powederdesigners.com/InforWeb.design_center/articles/DC-DC/converter.shtm, undated.

"Notification of Transmittal of The International Search Report or the Declaration", PCT/US02/29461.

"Notification of Transmittal of The International Search Report or the Declaration", PCT/US03/07546.

"Notification of Transmittal of The International Search Report or the Declaration", PCT/US03/06577.

"Notification of Transmittal of the International Search Report or the Declaration", PCT/US03/07837.

"Improved Impedance Spectroscopy Technique for Status Determination of Production Li/SO$_2$ Batteries" Terrill Atwater et al., pp. 10-113, (1992).

"Notification of Transmittal of The International Search Report or the Declaration", PCT/US03/41561.

"Notification of Transmittal of The International Search Report or the Declaration", PCT/US03/27696.

"Programming Training Course, 62-000 Series Smart Engine Analyzer", Testproducts Division, Kalamazoo, Michigan, pp. 1-207, (1984).

"Operators Manual, Modular Computer Analyzer Model MCA 3000", Sun Electric Corporation, Crystal Lake, Illinois, pp. 1-1-14-13, (1991).

Supplementary European Search Report Communication for Appl. No. 99917402.2.

"Dynamic modelling of lead/acid batteries using impedance spectroscopy for parameter identification", Journal of Power Sources, pp. 69-84, (1997).

Notification of Transmittal of the International Search Report for PCT/US03/30707.

"A review of impedance measurements for determination of the state-of-charge or state-of-health of secondary batteries", Journal of Power Sources, pp. 59-69, (1998).

"Search Report Under Section 17" for Great Britain Application No. GB0421447.4.

"Results of Discrete Frequency Immittance Spectroscopy (DFIS) Measurements of Lead Acid Batteries", by K.S. Champlin et al., *Proceedings of 23rd International Teleco Conference (INTELEC)*, published Oct. 2001, IEE, pp. 433-440.

"Examination Report" from the U.K. Patent Office for U.K. App. No. 0417678.0.

Wikipedia Online Encyclopedia, Inductance, 2005, http://en.wikipedia.org/wiki/inductance, pp. 1-5, mutual Inductance, pp. 3,4.

"Professional BCS System Analyzer Battery-Charger-Starting", pp. 2-8, (2001).

Young Illustrated Encyclopedia Dictionary of Electronics, 1981, Parker Publishing Company, Inc., pp. 318-319.

"A Microprocessor-Based Control System for a Near-Term Electric Vehicle", Bimal K. Bose; IEEE Transactions on Industry Applications, vol. IA-17, No. 6, Nov./Dec. 198?,; 0093-9994/81/1100-0626$00.75 © 1981 IEEE, 6 pages.

"DSP Applications in Hybrid Electric Vehicle Powertrain", Miller et al., Proceedings of the American Control Conference, Sand Diego, CA, Jun. 1999; 2 ppg.

"Notification of Transmittal of the International Search Report and the Written Opinion of the International Searching Authority, or the Declaration" for PCT/US2008/008702 filed Jul. 2008; 15 pages.

Office Action from corresponding Japanese application Serial No. 2003-360587, dated Aug. 30, 2010.

"Evaluating the State-of-Health of Lead Acid Hooded and Valve-Regulated Batteries: A Comparison of Conductance Testing vs. Traditional Methods", by M. Hlavac et al., Jun. 1993, pp. 1-15; (20 total pgs.).

"Updated State of Conductance/Capacity Correlation Studies to Determine the State-of-Health of Automotive SLI and Standby Lead Acid Batteries", by D. Feder et al., Sep. 1993, pp. 1-17; (22 total pgs.).

"Notification of Transmittal of the International Search Report and the Written Opinion of the International Searching Authority, or the Declaration" for PCT/US2011/038279, filed May 27, 2011, date of mailing Sep. 16, 2011, 12 pgs.

U.S. Appl. No. 60/387,912, filed Jun. 13, 2002 which is related to U.S. Patent No. 7,089,127.

Search Report and Written Opinion from PCT Application No. PCT/US2011/015508, dated Aug. 29, 2011, 9 pages.

"Conductance Testing Compared to Traditional Methods of Evaluating the Capacity of Valve-Regulated Lead-Acid Batteries and Predicting State-of-Health", by D. Feder et al., May 1992, pp. 1-8; (13 total pgs.).

"Field and Laboratory Studies to Assess the State of Health of Valve-Regulated Lead Acid Batteries: Part I—Conductance/Capacity Correlation Studies", by D. Feder at al., Oct. 1992, pp. 1-15; (19 total pgs.).

Search Report and Written Opinion from PCT Application No. PCT/US2011/026608, dated Aug. 29, 2011, 9 pages.

"Field Application of Conductance Measurements Use to Ascertain Cell/Battery and Inter-Cell Connection State-of-Health in Electric Power Utility Applications", by M. Hlavac et al., Apr. 1993, pp. 1-14; (19 total pgs.).

"Conductance Testing of Standby Batteries in Signaling and Communications Applications for the Purpose of Evaluating Battery State-of-Health", by S. McShane, Apr. 1993, pp. 1-9; (14 total pgs.).

"Condutance Monitoring of Recombination Lead Acid Batteries", by B. Jones, May 1993, pp. 1-6; (11 total pgs.).

"Field and Laboratory Studies to Access the State-of-Health of Valve-Regulated Lead-Acid Battery Technologies Using Conductance Testing Part II—Further Conductance/Capacity Correlation Studies", by M. Hlavac et al., Sep. 1993, pp. 1-9; (14 total pgs.).

"Field Experience of Testing VRLA Batteries by Measuring Conductance", by M.W. Kniveton, May 1994, pp. 1-4; (9 total pgs.).

"Reducing the Cost of Maintaining VRLA Batteries in Telecom Applications", by M.W. Kniveton, Sep. 1994, pp. 1-5; (10 total pgs.).

"Analysis and Interpretation of Conductance Measurements used to Access the State-of-Health of Valve Regulated Lead Acid Batteries Part III: Analytical Techniques", by M. Hlavac, Nov. 1994, 9 pgs; (13 total pgs.).

"Testing 24 Volt Aircraft Batteries Using Midtronics Conductance Technology", by M. Hlavac et al., Jan. 1995, 9 pgs; (13 total pgs.).

"VRLA Battery Monitoring Using Conductance Technology Part IV: On-Line State-of-Health Monitoring and Thermal Runaway Detection/Prevention", by M. Hlavac et al., Oct. 1995, 9 pgs; (13 total pgs.).

"VRLA Battery Conductance Monitoring Part V: Strategies for VRLA Battery Testing and Monitoring in Telecom Operating Environments", by M. Hlavac et al., Oct. 1996, 9 pgs; (13 total pgs.).

"Midpoint Conductance Technology Used in Telecommunication Stationary Standby Battery Applications Part VI: Considerations for Deployment of Midpoint Conductance in Telecommunications Power Applications", by M. Troy et al., Oct. 1997, 9 pgs; (13 total pgs.).

"Impedance/Conductance Measurements as an Aid to Determining Replacement Strategies", M. Kniveton, Sep. 1998, pp. 297-301; (9 total pgs.).

"A Fundamentally New Approach to Battery Performance Analysis Using DFRA™/DTIS™ Technology", by K. Champlin et al., Sep. 2000, 8 pgs; (12 total pgs.).

"Battery State of Health Monitoring, Combining Conductance Technology With Other Measurement Parameters for Real-Time Battery Performance Analysis", by D. Cox et la., Mar. 2000, 6 pgs; (10 total pgs.).

Office Action from related U.S. Appl. No. 11/352,945, dated Jan. 5, 2007, 12 pages.

Office Action from related U.S. Appl. No. 11/352,945, dated Jul. 6, 2007, 28 pages.

Office Action from related U.S. Appl. No. 10/958,812, dated Apr. 10, 2007, 7 pages.

Office Action from related U.S. Appl. No. 10/958,812, dated Oct. 18, 2007, 5 pages.

Office Action from related U.S. Appl. No. 10/958,812, dated Nov. 16, 2007, 4 pages.

Office Action from related U.S. Appl. No. 10/883,019, dated Jun. 22, 2011, 10 pages.

Office Action from related U.S. Appl. No. 10/883,019, dated Oct. 5, 2011, 9 pages.

Office Action from related U.S. Appl. No. 10/460,749, dated Dec. 13, 2004, 6 pages.

Office Action from related U.S. Appl. No. 10/280,186, dated Oct. 14, 2003, 6 pages.

\* cited by examiner

Fig. 5

BATTERY TESTERS WITH SECONDARY FUNCTIONALITY

CROSS-REFERENCE TO RELATED APPLICATION

The present application is a Continuation of application Ser. No. 11/352,945, filed Feb. 13, 2006 which is based on and claims the benefit of U.S. provisional patent application Ser. No. 60/731,881, filed Oct. 31, 2005, the present application is also a continuation-in-part and claims priority of U.S. Ser. No. 10/958,812, filed Oct. 5, 2004 which is a continuation-in-part of U.S. Ser. No. 10/460,749, filed Jun. 12, 2003, which is a continuation-in-part of U.S. Ser. No. 10/280,186, filed Oct. 25, 2002, now U.S. Pat. No. 6,759,849, which is a continuation-in-part of U.S. Ser. No. 09/816,768, filed Mar. 23, 2001, now U.S. Pat. No. 6,586,941, which claims the benefit of U.S. Provisional Patent Application Ser. No. 60/192,222, filed Mar. 27, 2000; application Ser. No. 11/352,945 is also a continuation-in-part of U.S. patent application Ser. No. 10/883,019, filed Jul. 1, 2004, which is a divisional of U.S. Ser. No. 10/280,186, filed Oct. 25, 2002, now U.S. Pat. No. 6,759,849, which is a continuation-in-part of U.S. Ser. No. 09/816,768, filed Mar. 23, 2001, now U.S. Pat. No. 6,586,941, which claims the benefit of U.S. Provisional patent application Ser. No. 60/192,222, filed Mar. 27, 2000, the contents of which are hereby incorporated by reference in their entirety.

BACKGROUND OF THE INVENTION

The present invention relates to battery testers. More specifically, the present invention relates to electronic battery testers used for testing storage batteries.

Storage batteries are an important component of modern automotive vehicles. Vehicles with internal combustion engines use such batteries to start the engine or run electrical equipment when the engine is not operating. Electric vehicles use such batteries as a source of power. It is frequently desirable to test storage batteries so that a failing battery can be identified and replaced prior to its ultimate failure, so that a battery with a low state of charge can be recharged, etc. Battery testers are typically limited to a few types of tests.

Many battery-testing techniques have been developed through the years. Midtronics, Inc. of Willowbrook, Ill. and Dr. Keith S. Champlin have been pioneers in battery testing and related technologies. Examples of their work are shown in U.S. Pat. No. 3,873,911, issued Mar. 25, 1975, to Champlin; U.S. Pat. No. 3,909,708, issued Sep. 30, 1975, to Champlin; U.S. Pat. No. 4,816,768, issued Mar. 28, 1989, to Champlin; U.S. Pat. No. 4,825,170, issued Apr. 25, 1989, to Champlin; U.S. Pat. No. 4,881,038, issued Nov. 14, 1989, to Champlin; U.S. Pat. No. 4,912,416, issued Mar. 27, 1990, to Champlin; U.S. Pat. No. 5,140,269, issued Aug. 18, 1992, to Champlin; U.S. Pat. No. 5,343,380, issued Aug. 30, 1994; U.S. Pat. No. 5,572,136, issued Nov. 5, 1996; U.S. Pat. No. 5,574,355, issued Nov. 12, 1996; U.S. Pat. No. 5,583,416, issued Dec. 10, 1996; U.S. Pat. No. 5,585,728, issued Dec. 17, 1996; U.S. Pat. No. 5,589,757, issued Dec. 31, 1996; U.S. Pat. No. 5,592,093, issued Jan. 7, 1997; U.S. Pat. No. 5,598,098, issued Jan. 28, 1997; U.S. Pat. No. 5,656,920, issued Aug. 12, 1997; U.S. Pat. No. 5,757,192, issued May 26, 1998; U.S. Pat. No. 5,821,756, issued Oct. 13, 1998; U.S. Pat. No. 5,831,435, issued Nov. 3, 1998; U.S. Pat. No. 5,871,858, issued Feb. 16, 1999; U.S. Pat. No. 5,914,605, issued Jun. 22, 1999; U.S. Pat. No. 5,945,829, issued Aug. 31, 1999; U.S. Pat. No. 6,002,238, issued Dec. 14, 1999; U.S. Pat. No. 6,037,751, issued Mar. 14, 2000; U.S. Pat. No. 6,037,777, issued Mar. 14, 2000; U.S. Pat. No. 6,051,976, issued Apr. 18, 2000; U.S. Pat. No. 6,081,098, issued Jun. 27, 2000; U.S. Pat. No. 6,091,245, issued Jul. 18, 2000; U.S. Pat. No. 6,104,167, issued Aug. 15, 2000; U.S. Pat. No. 6,137,269, issued Oct. 24, 2000; U.S. Pat. No. 6,163,156, issued Dec. 19, 2000; U.S. Pat. No. 6,172,483, issued Jan. 9, 2001; U.S. Pat. No. 6,172,505, issued Jan. 9, 2001; U.S. Pat. No. 6,222,369, issued Apr. 24, 2001; U.S. Pat. No. 6,225,808, issued May 1, 2001; U.S. Pat. No. 6,249,124, issued Jun. 19, 2001; U.S. Pat. No. 6,259,254, issued Jul. 10, 2001; U.S. Pat. No. 6,262,563, issued Jul. 17, 2001; U.S. Pat. No. 6,294,896, issued Sep. 25, 2001; U.S. Pat. No. 6,294,897, issued Sep. 25, 2001; U.S. Pat. No. 6,304,087, issued Oct. 16, 2001; U.S. Pat. No. 6,310,481, issued Oct. 30, 2001; U.S. Pat. No. 6,313,607, issued Nov. 6, 2001; U.S. Pat. No. 6,313,608, issued Nov. 6, 2001; U.S. Pat. No. 6,316,914, issued Nov. 13, 2001; U.S. Pat. No. 6,323,650, issued Nov. 27, 2001; U.S. Pat. No. 6,329,793, issued Dec. 11, 2001; U.S. Pat. No. 6,331,762, issued Dec. 18, 2001; U.S. Pat. No. 6,332,113, issued Dec. 18, 2001; U.S. Pat. No. 6,351,102, issued Feb. 26, 2002; U.S. Pat. No. 6,359,441, issued Mar. 19, 2002; U.S. Pat. No. 6,363,303, issued Mar. 26, 2002; U.S. Pat. No. 6,377,031, issued Apr. 23, 2002; U.S. Pat. No. 6,392,414, issued May 21, 2002; U.S. Pat. No. 6,417,669, issued Jul. 9, 2002; U.S. Pat. No. 6,424,158, issued Jul. 23, 2002; U.S. Pat. No. 6,441,585, issued Aug. 17, 2002; U.S. Pat. No. 6,437,957, issued Aug. 20, 2002; U.S. Pat. No. 6,445,158, issued Sep. 3, 2002; U.S. Pat. No. 6,456,045; U.S. Pat. No. 6,466,025, issued Oct. 15, 2002; U.S. Pat. No. 6,465,908, issued Oct. 15, 2002; U.S. Pat. No. 6,466,026, issued Oct. 15, 2002; U.S. Pat. No. 6,469,511, issued Nov. 22, 2002; U.S. Pat. No. 6,495,990, issued Dec. 17, 2002; U.S. Pat. No. 6,497,209, issued Dec. 24, 2002; U.S. Pat. No. 6,507,196, issued Jan. 14, 2003; U.S. Pat. No. 6,534,993; issued Mar. 18, 2003; U.S. Pat. No. 6,544,078, issued Apr. 8, 2003; U.S. Pat. No. 6,556,019, issued Apr. 29, 2003; U.S. Pat. No. 6,566,883, issued May 20, 2003; U.S. Pat. No. 6,586,941, issued Jul. 1, 2003; U.S. Pat. No. 6,597,150, issued Jul. 22, 2003; U.S. Pat. No. 6,621,272, issued Sep. 16, 2003; U.S. Pat. No. 6,623,314, issued Sep. 23, 2003; U.S. Pat. No. 6,633,165, issued Oct. 14, 2003; U.S. Pat. No. 6,635,974, issued Oct. 21, 2003; U.S. Pat. No. 6,707,303, issued Mar. 16, 2004; U.S. Pat. No. 6,737,831, issued May 18, 2004; U.S. Pat. No. 6,744,149, issued Jun. 1, 2004; U.S. Pat. No. 6,759,849, issued Jul. 6, 2004; U.S. Pat. No. 6,781,382, issued Aug. 24, 2004; U.S. Pat. No. 6,788,025, filed Sep. 7, 2004; U.S. Pat. No. 6,795,782, issued Sep. 21, 2004; U.S. Pat. No. 6,805,090, filed Oct. 19, 2004; U.S. Pat. No. 6,806,716, filed Oct. 19, 2004; U.S. Pat. No. 6,850,037, filed Feb. 1, 2005; U.S. Pat. No. 6,850,037, issued Feb. 1, 2005; U.S. Pat. No. 6,871,151, issued march 22, 2005; U.S. Pat. No. 6,885,195, issued Apr. 26, 2005; U.S. Pat. No. 6,888,468, issued May 3, 2005; U.S. Pat. No. 6,891,378, issued May 10, 2005; U.S. Pat. No. 6,906,522, issued Jun. 14, 2005; U.S. Pat. No. 6,906,523, issued Jun. 14, 2005; U.S. Pat. No. 6,909,287, issued Jun. 21, 2005; U.S. Pat. No. 6,914,413, issued Jul. 5, 2005; U.S. Pat. No. 6,913,483, issued Jul. 5, 2005; U.S. Pat. No. 6,930,485, issued Aug. 16, 2005; U.S. Pat. No. 6,933,727, issued Aug. 23, 200; U.S. Pat. No. 6,941,234, filed Sep. 6, 2005; U.S. Pat. No. 6,967,484, issued Nov. 22, 2005; U.S. Pat. No. 6,998,847, issued Feb. 14, 2006; U.S. Pat. No. 7,003,410, issued Feb. 21, 2006; U.S. Pat. No. 7,003,411, issued Feb. 21, 2006; U.S. Pat. No. 7,012,433, issued Mar. 14, 2006; U.S. Pat. No. 7,015,674, issued Mar. 21, 2006; U.S. Pat. No. 7,034,541, issued Apr. 25, 2006; U.S. Pat. No. 7,039,533, issued May 2, 2006; U.S. Pat. No. 7,058,525, issued Jun. 6, 2006; U.S. Pat. No. 7,081,755, issued Jul. 25, 2006; U.S. Pat. No. 7,106,070, issued Sep. 12, 2006; U.S. Pat. No. 7,116,109, issued Oct. 3, 2006; U.S. Pat. No. 7,119,686, issued Oct. 10, 2006; and U.S. Pat. No. 7,126,341, issued Oct. 24, 2006; U.S. Pat. No. 7,154,276, issued Dec. 26, 2006; U.S. Pat. No. 7,198,510, issued Apr. 3, 2007; U.S. Pat. No. 7,363,175, issued Apr. 22, 2008; U.S. Pat. No. 7,208,914, issued Apr. 24, 2007; U.S. Pat. No. 7,246,015, issued Jul. 17, 2007; U.S. Pat. No. 7,295,936, issued Nov. 13, 2007; U.S. Pat. No. 7,319,304, issued Jan. 15, 2008; U.S. Ser. No. 09/780,146, filed Feb. 9, 2001, entitled STORAGE BATTERY WITH INTEGRAL BATTERY TESTER; U.S. Ser. No. 09/756,638, filed Jan. 8, 2001, entitled METHOD AND APPARATUS FOR DETERMINING BATTERY PROPERTIES FROM COMPLEX IMPEDANCE/ADMITTANCE; U.S. Ser. No. 09/862,783, filed May 21, 2001, entitled METHOD AND APPARATUS FOR TESTING CELLS AND BATTERIES EMBEDDED IN SERIES/PARALLEL SYSTEMS; U.S. Ser. No. 09/880,473, filed Jun. 13, 2001; entitled BATTERY TEST MODULE; U.S. Ser. No. 10/042,451, filed Jan. 8, 2002, entitled BATTERY CHARGE CONTROL DEVICE; U.S. Ser. No. 10/109,734, filed Mar. 28, 2002, entitled APPARATUS AND METHOD FOR COUNTERACTING SELF DISCHARGE IN A STORAGE BATTERY; U.S. Ser. No. 10/112,998, filed Mar. 29, 2002, entitled BATTERY TESTER WITH BATTERY REPLACEMENT OUTPUT; U.S. Ser. No. 10/263,473, filed Oct. 2, 2002, entitled ELECTRONIC BATTERY TESTER WITH RELATIVE TEST OUTPUT; U.S. Ser. No. 10/310,385, filed Dec. 5, 2002, entitled BATTERY TEST MODULE; U.S. Ser. No. 10/462,323, filed Jun. 16, 2003, entitled ELECTRONIC BATTERY TESTER HAVING A USER INTERFACE TO CONFIGURE A PRINTER; U.S. Ser. No. 10/653,342, filed Sep. 2, 2003, entitled ELECTRONIC BATTERY TESTER CONFIGURED TO PREDICT A LOAD TEST RESULT; U.S. Ser. No. 10/441,271, filed May 19, 2003, entitled ELECTRONIC BATTERY TESTER; U.S. Ser. No. 09/653,963, filed Sep. 1, 2000, entitled SYSTEM AND METHOD FOR CONTROLLING POWER GENERATION AND STORAGE; U.S. Ser. No. 10/174,110, filed Jun. 18, 2002, entitled DAYTIME RUNNING LIGHT CONTROL USING AN INTELLIGENT POWER MANAGEMENT SYSTEM; U.S. Ser. No. 10/258,441, filed Apr. 9, 2003, entitled CURRENT MEASURING CIRCUIT SUITED FOR BATTERIES; U.S. Ser. No. 10/681,666, filed Oct. 8, 2003, entitled ELECTRONIC BATTERY TESTER WITH PROBE LIGHT; U.S. Ser. No. 10/783,682, filed Feb. 20, 2004, entitled REPLACEABLE CLAMP FOR ELECTRONIC BATTERY TESTER; U.S. Ser. No. 10/791,141, filed Mar. 2, 2004, entitled METHOD AND APPARATUS FOR AUDITING A BATTERY TEST; U.S. Ser. No. 10/867,385, filed Jun. 14, 2004, entitled ENERGY MANAGEMENT SYSTEM FOR AUTOMOTIVE VEHICLE; U.S. Ser. No. 10/896,834, filed Jul. 22, 2004, entitled ELECTRONIC BATTERY TESTER; U.S. Ser. No. 10/958,821, filed Oct. 5, 2004, entitled IN-VEHICLE BATTERY MONITOR; U.S. Ser. No. 10/958,812, filed Oct. 5, 2004, entitled SCAN TOOL FOR ELECTRONIC BATTERY TESTER; U.S. Ser. No. 11/008,456, filed Dec. 9, 2004, entitled APPARATUS AND METHOD FOR PREDICTING BATTERY CAPACITY AND FITNESS FOR SERVICE FROM A BATTERY DYNAMIC PARAMETER AND A RECOVERY VOLTAGE DIFFERENTIAL, U.S. Ser. No. 60/587,232, filed Dec. 14, 2004, entitled CELLTRON ULTRA, U.S. Ser. No. 11/018,785, filed Dec. 21, 2004, entitled WIRELESS BATTERY MONITOR; U.S. Ser. No. 60/653,537, filed Feb. 16, 2005, entitled CUSTOMER MANAGED WARRANTY CODE; U.S. Ser. No. 11/063,247, filed Feb. 22, 2005, entitled ELECTRONIC BATTERY TESTER OR CHARGER WITH DATABUS CONNECTION; U.S. Ser. No. 60/665,070, filed Mar. 24, 2005, entitled OHMMETER PROTECTION CIRCUIT; U.S. Ser. No. 11/141,234, filed May 31, 2005, entitled BATTERY TESTER CAPABLE OF IDENTIFYING FAULTY BATTERY POST ADAPTERS; U.S. Ser. No. 11/143,828, filed Jun. 2, 2005, entitled BATTERY TEST MODULE; U.S. Ser. No. 11/146,608, filed Jun. 7, 2005, entitled SCAN TOOL FOR ELECTRONIC BATTERY TESTER; U.S. Ser. No. 60/694,199, filed Jun. 27, 2005, entitled GEL BATTERY CONDUCTANCE COMPENSATION; U.S. Ser. No. 11/178,550, filed Jul. 11, 2005, entitled WIRELESS BATTERY TESTER/CHARGER; U.S. Ser. No. 60/705,389, filed Aug. 4, 2005, entitled PORTABLE TOOL THEFT PREVENTION SYSTEM, U.S. Ser. No. 11/207,419, filed Aug. 19, 2005, entitled SYSTEM FOR AUTOMATICALLY GATHERING BATTERY INFORMATION FOR USE DURING BATTERY TESTER/CHARGING, U.S. Ser. No. 60/712,322, filed Aug. 29, 2005, entitled AUTOMOTIVE VEHICLE ELECTRICAL SYSTEM DIAGNOSTIC DEVICE, U.S. Ser. No. 60/713,168, filed Aug. 31, 2005, entitled LOAD TESTER SIMULATION WITH DISCHARGE COMPENSATION, U.S. Ser. No. 60/731,881, filed Oct. 31, 2005, entitled PLUG-IN FEATURES FOR BATTERY TESTERS; U.S. Ser. No. 60/731,887, filed Oct. 31, 2005, entitled AUTOMOTIVE VEHICLE ELECTRICAL SYSTEM DIAGNOSTIC DEVICE; U.S. Ser. No. 11/304,004, filed Dec. 14, 2005, entitled BATTERY TESTER THAT CALCULATES ITS OWN REFERENCE VALUES; U.S. Ser. No. 60/751,853, filed Dec. 20, 2005, entitled BATTERY MONITORING SYSTEM; U.S. Ser. No. 11/304,004, filed Dec. 14, 2005, entitled BATTERY TESTER WITH CALCULATES ITS OWN REFERENCE VALUES; U.S. Ser. No. 60/751,853, filed Dec. 20, 2005, entitled BATTERY MONITORING SYSTEM; U.S. Ser. No. 11/352,945, filed Feb. 13, 2006, entitled BATTERY TESTERS WITH SECONDARY FUNCTIONALITY; U.S. Ser. No. 11/356,299, filed Feb. 16, 2006, entitled CENTRALLY MONITORED SALES OF STORAGE BATTERIES; U.S. Ser. No. 11/356,443, filed Feb. 16, 2006, entitled ELECTRONIC BATTERY TESTER WITH NETWORK COMMUNICATION; U.S. Ser. No. 11/498,703, filed Aug. 3, 2006, entitled THEFT PREVENTION DEVICE FOR AUTOMOTIVE VEHICLE SERVICE CENTERS; U.S. Ser. No. 11/507,157, filed Aug. 21, 2006, entitled APPARATUS AND METHOD FOR SIMULATING A BATTERY TESTER WITH A FIXED RESISTANCE LOAD; U.S. Ser. No. 11/511,872, filed Aug. 29, 2006, entitled AUTOMOTIVE VEHICLE ELECTRICAL SYSTEM DIAGNOSTIC DEVICE; U.S. Ser. No. 11/519,481, filed Sep. 12, 2006, entitled BROAD-BAND LOW-CONDUCTANCE CABLES FOR MAKING KELVIN CONNECTIONS TO ELECTROCHEMICAL CELLS AND BATTERIES; U.S. Ser. No. 60/847,064, filed Sep. 25, 2006, entitled STATIONARY BATTERY MONITORING ALGORITHMS; U.S. Ser. No. 11/638,771, filed Dec. 14, 2006, entitled BATTERY MONITORING SYSTEM; U.S. Ser. No. 11/641,594, filed Dec. 19, 2006, entitled METHOD AND APPARATUS FOR MEASURING A PARAMETER OF A VEHICLE ELECTRONIC SYSTEM; U.S. Ser. No. 11/711,356, filed Feb. 27, 2007, entitled BATTERY TESTER WITH PROMOTION FEATURE; U.S. Ser. No. 11/811,528, filed Jun. 11, 2007, entitled ALTERNATOR TESTER; U.S. Ser. No. 60/950,182, filed Jul. 17, 2007, entitled BATTERY TESTER FOR HYBRID VEHICLE; U.S. Ser. No. 60/973,879, filed Sep. 20, 2007, entitled ELECTRONIC BATTERY TESTER FOR TESTING STATIONARY BATTERIES; U.S. Ser. No. 11/931,907, filed Oct. 31, 2007, entitled BATTERY MAINTENANCE WITH PROBE LIGHT; U.S. Ser. No. 60/992,798, filed Dec. 6, 2007, entitled STORAGE BATTERY AND BATTERY TESTER; U.S. Ser. No. 12/099,826, filed Apr. 9, 2008, entitled BATTERY RUN DOWN INDICATOR; which are incorporated herein in their entirety.

SUMMARY OF THE INVENTION

An electronic vehicle tester includes a battery tester configured to measure a parameter of a battery of a vehicle. A tire tester is configured to receive a parameter of a tire of the vehicle. A wireless receiver can be configured to receive pressure information from a transmitter associated with a tire of a vehicle.

DETAILED DESCRIPTION OF THE PREFERRED EMBODIMENTS

The present invention provides an electronic battery tester for testing storage batteries in which removable modules can be selectively coupled to the electronic battery tester to extend the functionality of the device. In one configuration, the additional functionality is built into the device and is not carried in a removable module. In various aspects, the invention includes an electronic battery tester adapted to couple to a removable module, a removable module itself and a combination of an electronic battery tester and a removable module. The following is a more detailed description of the invention. However, in broad aspects, the present invention is not limited to the specific configurations or example modules set forth herein.

Figure 1:
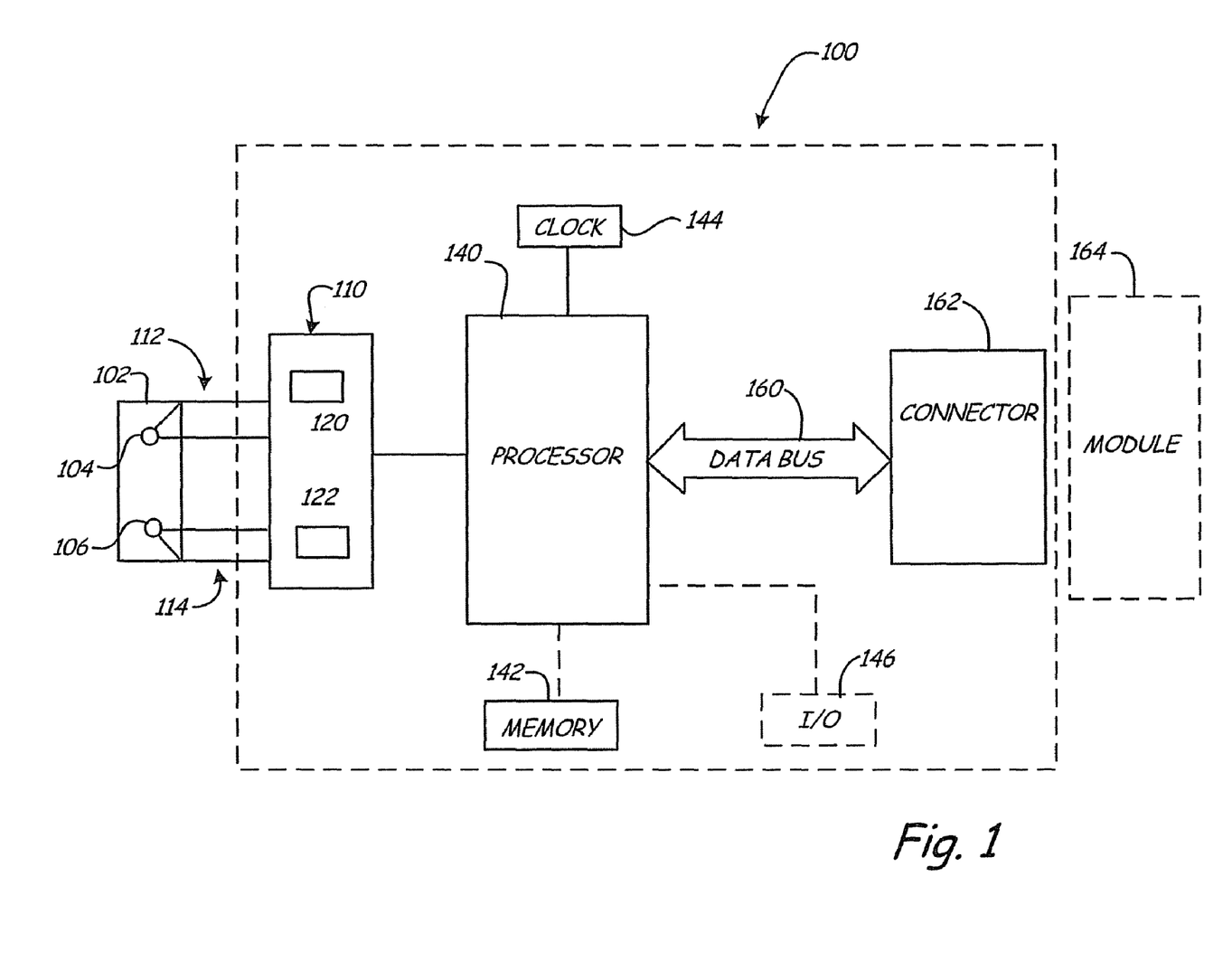
FIG. 1 is a simplified block diagram of a battery tester and a removable module.

FIG. 1 is a simplified diagram of a battery tester 100 configured to test a storage battery 102. Storage battery 102 includes terminals 104 and 106 and may comprise a single cell or a plurality of cells. Battery tester 100 includes battery test circuitry 110 which electrically couples to battery 102 to terminals 104 and 106 of battery 102 through Kelvin connections 112 and 114, respectively. In one aspect, the connection between test circuitry 110 and battery 102 can be through any appropriate means and is not limited to Kelvin connections. For example, a split Kelvin configuration, non-Kelvin connections and/or current sensors can be used. In one specific embodiment circuitry 110 includes a forcing function source 120 configured to apply a forcing function signal to battery 102 through Kelvin connections 112 and 114. In such an embodiment, circuitry 110 may also include a response sensor 122 electrically coupled to battery 102 through Kelvin connections 112, 114. The response sensor 122 is configured to sense an electrical response of battery 102 to the applied forcing function signal. The forcing function signal includes a time varying component and can be applied either by injecting a signal or selectively applying a load to the battery 102.

A digital processor 140 is electrically coupled to circuitry 110 and is configured to test the storage battery 102. Processor 140 operates in accordance with instructions stored in some type of a memory 142 and at a rate determined by clock 144. In one specific embodiment, processor 140 measures a dynamic parameter of battery 102. An optional input/output (I/O) 146 is provided for coupling to other equipment and/or for operation by a user.

In accordance with the present invention, a data bus 160 is provided which couples processor 140 to a connector 162. The data bus 160 can carry digital or analog data along with analog signals or electrical power as desired. Connector 162 is configured to couple to a removable module 164 which can be selectively coupled to battery tester 100 to add functionality to battery tester 100.

Figure 2:
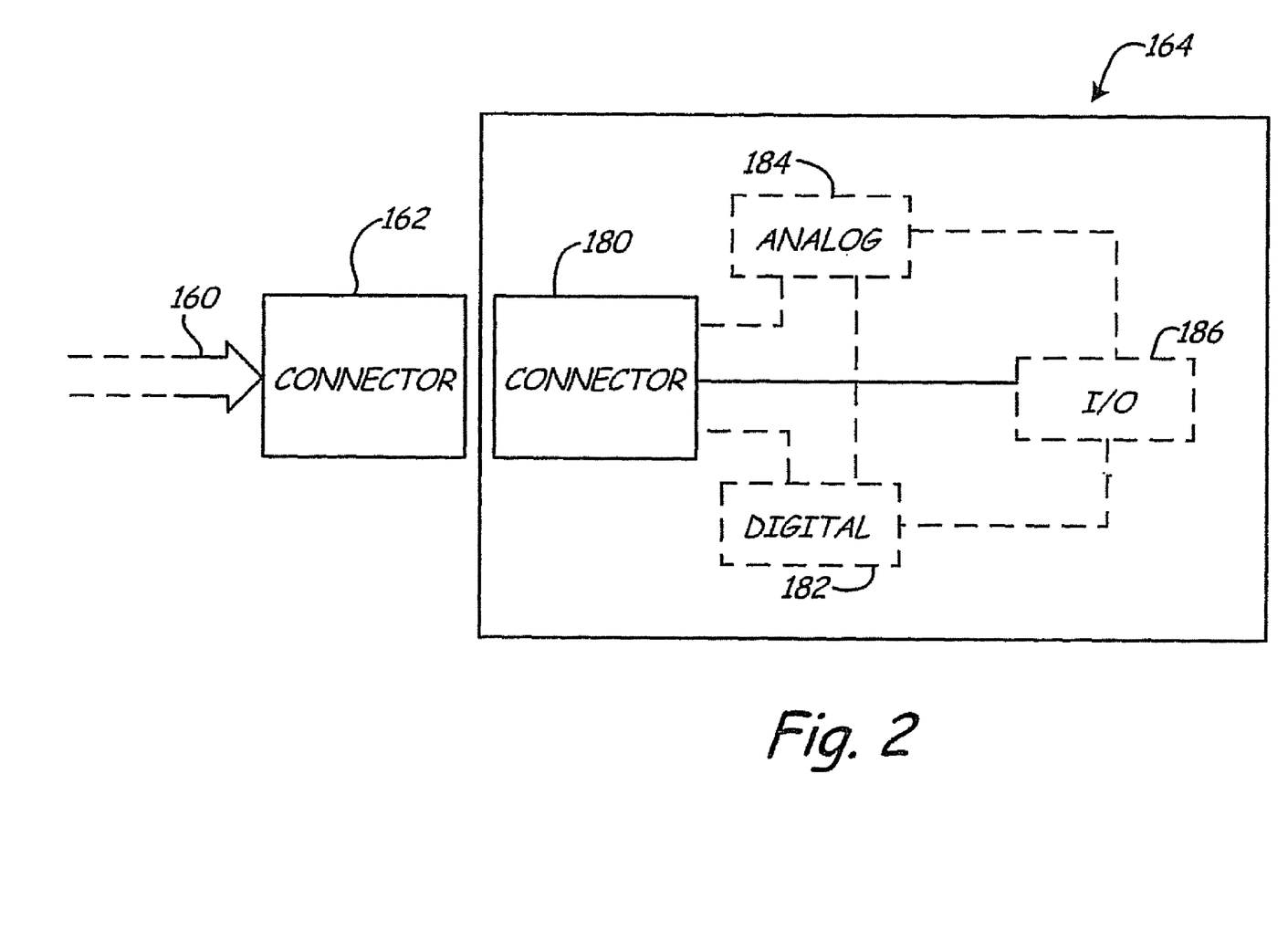
FIG. 2 is a more detailed block diagram of the removable module shown in FIG. 1.

FIG. 2 is a simplified block diagram of one example of a removable module 164 and shows various component blocks which can be included in module 164. Module 164 includes a connector 180 configured to mate with connector 162 of battery tester 100 and thereby provide a connection to data bus 160. In one aspect, optional digital circuitry 182 is provided and coupled to data bus 160 through connectors 180 and 162. Similarly, in another example aspect, optional analog circuitry 184 is provided and can also couple to data bus 160 through connectors 180 and 162. Another optional circuit is illustrated as input/output circuit 186 which can couple to data bus 160 through connectors 180 and 162. Removable module 164 can include any combination of circuits 182, 184 and 186. Further, these circuits can optionally interconnect with one another.

Figure 3:
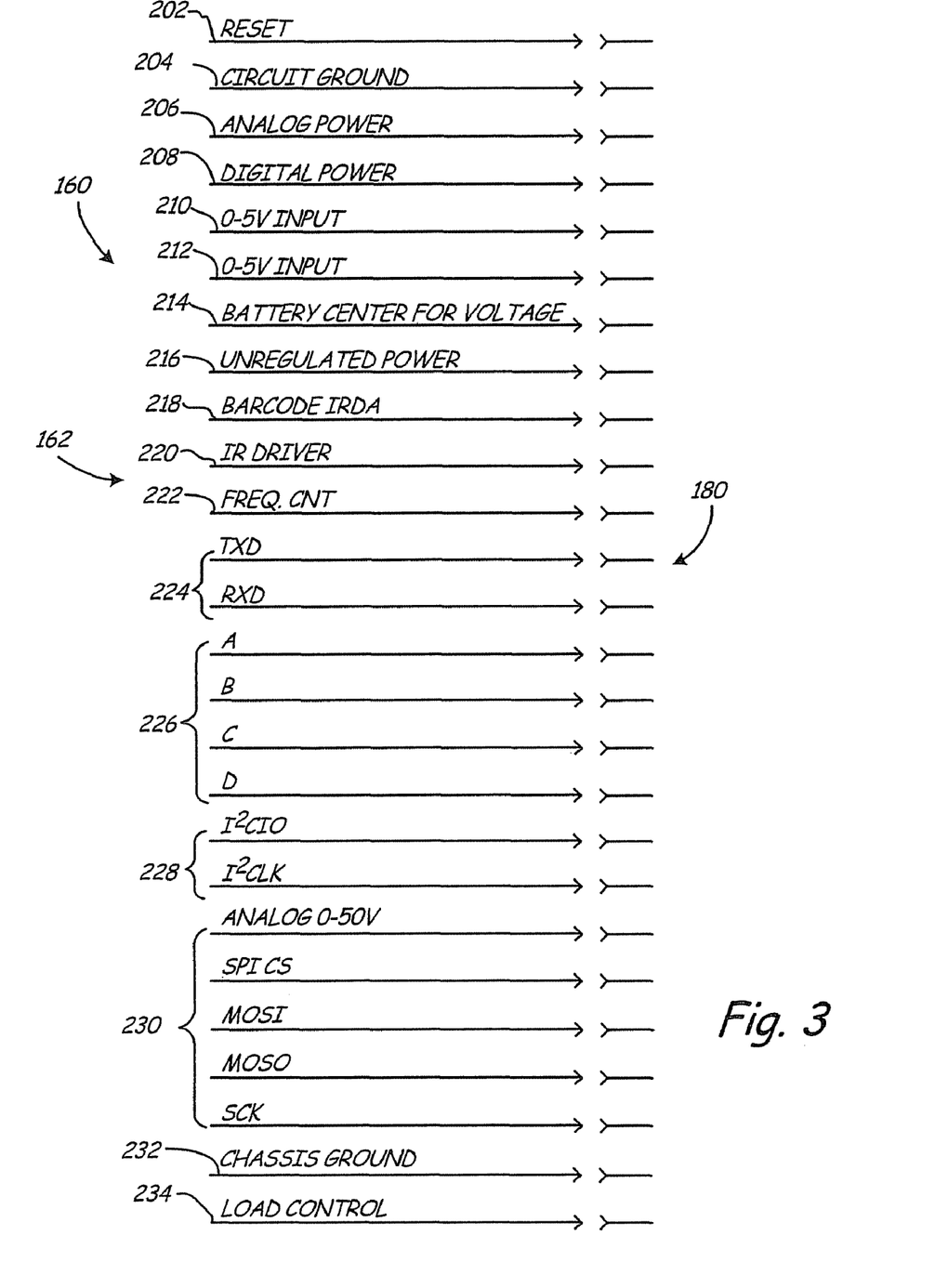
FIG. 3 is an electrical schematic diagram showing electrical lines or connections in the connector which couples the battery tester to the removable module illustrated in FIG. 1.

FIG. 3 is a electrical diagram showing specific electrical connections provided in one embodiment of connectors 162 and 180. These connections are shown for example only and the present invention is not limited to this particular configuration. The electrical connections shown in FIG. 3 form the data bus 160 illustrated in FIGS. 1 and 2.

A reset connection 202 carries a reset signal between battery tester 100 and module 164 such that either unit can cause a reset to occur in the other. This is useful if one of the units is not responding. Line 204 carries a circuit ground while lines 206 and 208 carry analog and digital power, respectively, from the battery tester 100 to the module 164. Lines 210 and 212 provide analog inputs from module 164 to battery tester 100. In a specific example, these inputs can range between 0 and 5 and can be configured to represent a variable in an analog format. Line 214 carries a battery center voltage connection and is used to couple to a center terminal of a multi-terminal battery. Unregulated power is provided on line 216. A bar code/IRDA connection is provided on line 218 and an IR driver connection is provided on line 220. The bar codes/IRDA connection can be used to receive data from module 164 and the IR driver line 220 can be used to send data to an external device, such as a printer, through module 164.

A frequency count line 222 is provided for transferring data relating to frequency. TXD and RXD lines are provided on a serial connection 224 for transferring data serially between module 164 and battery tester 100. Connectors 226 provide a connection through Kelvin connectors 112 and 114 and are identified as A, B, C and D. This allows module 164 to have direct access to the Kelvin connectors 112 and 114.

A two-line data bus connection 228 is provided in accordance with the I$^2$C standard for bi-directional communication between battery tester 100 and module 164. Additionally, five lines are provided for a data bus 230 which operates in accordance with the SPI standard for data communication between battery tester 100 and module 164. A chassy ground is provided on line 232 and a load control is provided on line 234. Load control line 234 is used to control application of a load contained in module 164.

The example data bus 160 shown in FIG. 3 provides a number of different electrical connections for sending signals between tester 100 and module 164. Depending on the particular signal lines being employed, tester 100 and module 164 should be configured appropriately. For example, if a serial bus 224 is used, processor 140 of battery tester 100 and digital circuitry 182 from module 164 should have appropriate circuitry to interface with such a serial connection.

In one embodiment, module 164 comprises a standard battery tester interface. For example, such an interface can provide a direct passthrough connection with no electronics itself and a standard battery interface is built into the main tester body.

In another example, module 164 comprises a 42 volt battery tester interface. In such an embodiment, the interface can provide voltage and/or conductance scaling by adjusting amplifiers and/or divider networks to scale a 42 volt input voltage, or other measurements such that they can be used with a standard battery tester interface. This allows a single test circuit to be used with differing battery types by scaling applied signals and/or measured values. This is not limited to the measurement of 42 volt batteries and can be applied to other battery sizes. In general, the battery test module can include circuitry which can scale a measurement.

Module 164 can comprise a hybrid vehicle interface. For example, instead of scaling a 42 volt battery voltage, a much high voltage can be scaled such as those present in hybrid vehicles, for example 250 to 400 volts.

Module 164 can comprise an OBDII connector such that battery tester 100 can access the OBDII data bus of a vehicle. In another example, module 164 comprises a multimeter to thereby add such functionality to battery tester 100. In such an example, Kelvin connectors 112 and 114 can be used to provide signals to module 164 through connection 226. The signals can be digitized using digital circuitry 182. This information is provided back to processor 140 and displayed or output on I/O 146. For example, voltage resistance or current can be measured. In a similar example, module 164 provides an oscilloscope function.

Communication functions can be provided through module 164 such as radio frequency or infrared and other wired or wireless communication I/O. For example, module 164 can provide an interface to a printer. In another example, module 164 includes a printer such that information can be printed directly.

Module 164 can include a memory which carries specific software to add additional software functionality to battery tester 100. Data security, encryption or software unlocking keys can also be provided by a memory in module 164.

Module 164 can include calibrated values such that specific calibrations can be performed on battery tester 100. For example, a calibration reference can be coupled to the tester 100. The value of the reference can be digitally communicated to the tester 100.

Module 164 can include additional processing circuitry to further process battery test data.

In one embodiment, analog circuitry 184 includes a large resistive load which can optionally be applied to battery 102 during a test. The load is configured to draw a large amount of current for performing a load test.

Removable module 164 can also provide a backup battery connection for operating circuitry of battery tester 100. A barcode reader can be included in module 164 such that module 164 can be used to read bar code information, for example on a vehicle or on a battery. This information can be used by the battery tester 100 or stored for future use. A data port can be included in module 164, such as a USB port or a PCMCIA port. This allows the battery tester 100 to couple to widely available modular devices used with personal computers. The module 164 may contain additional memory for storage or data logging or a real time clock.

Module 164 can also contain circuitry or stored algorithms for performing additional tests such as testing the alternator of a vehicle or the starter, etc.

Figure 4A:
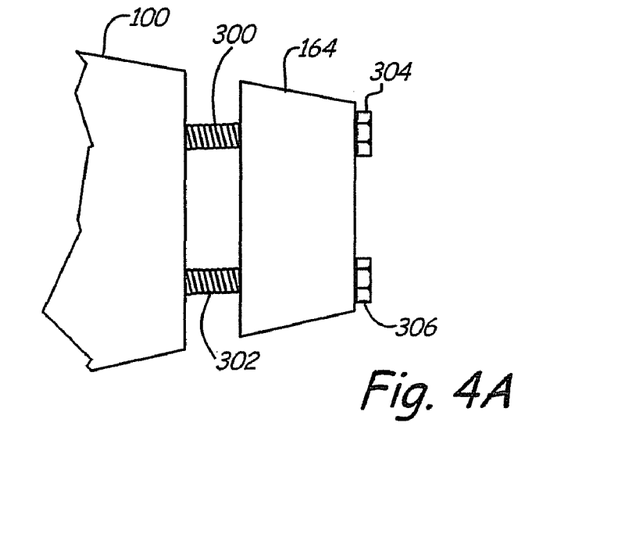
FIGS. 4A, 4B and 4C show couplings between the battery tester and removable module.
Figure 4B:
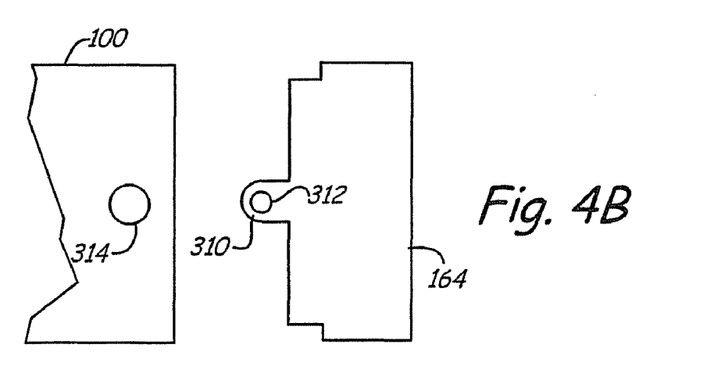
Figure 4C:
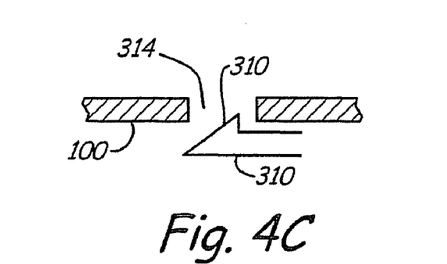

Removable module 164 can be coupled to measure battery tester 100 using any appropriate technique. For example, FIG. 4A is a side view showing battery test module 164 coupling to battery tester 100 through screws 300 and 302. Finger grips 304 and 306 can be used to manually tighten the screws 300, 302, respectively, by an operator. FIG. 4B is a side view shown another attachment technique in which a spring loaded members 310 includes a protrusion 312 which fits into a receptacle 314. A more detailed view is shown in the cross-sectional view of FIG. 4C. Other attachment techniques include separate screws or attachment elements, snap fit techniques, etc. The mechanisms can be separate elements, molded into the cases of battery tester 100 and/or removable module 164, etc.

In one configuration, the module 164 is used to provide any number of different types of secondary functionality to the battery tester 100. The module 164 can be removably coupled to a connector, or can be spaced apart from the battery tester and communicate using wireless techniques, or can be contained internally to the tester 100.

In one specific configuration, the module is used to measure various parameters of tires of a vehicle. For example, the module 164 can include a depth gauge used to determine remaining life of tires. The depth gauge can be mechanical, optical or use other techniques. The module can also include an air pressure gauge which is coupled to a valve of the tire to provide an electrical output. In some newer vehicles, tire pressure sensors are carried with the tire and provide a wireless output, such as a RF signal. In such a configuration, the module 164 can be configured to receive the tire pressure information over the wireless connection.

Other example sensors which can provide secondary functionality include a brake pad wear sensor, a brake rotor wear sensor, a fluid level sensor, an exhaust emission sensor, temperature sensors, etc. In various configurations, the sensors can either plug into the battery tester 100, be built into the tester, be wired to it by a cable, or communicate wirelessly using, for example, infrared or radio frequency. In one configuration used for measuring parameters of a tire, the sensor can include a means to encode which tire is being read. For example, buttons can be used to indicate left front, right front, left rear and right rear tire of the vehicle so that the readings can be correlated to the correct tire pressure. The data may be merged with battery data or be used independently. In another example, the data can be encoded into an audit code. In such a configuration, the data is encoded in a manner to reduce fraudulent manipulation of the data. The data can be stored locally, for example on a temporary memory such as a flash card, or can be transmitted to a remote location such as a point of sale. Example transmission techniques include wireless techniques such as infrared or radio frequency, and any appropriate protocol including for example, TCP/IP.

The data read back from the sensor can be compared against limits and used to trigger alarms. The limits can be based upon the type of vehicle being examined or based on other criteria. Additionally, data collected following maintenance can be compared with data collected prior to performing maintenance. For example, vehicle information can be stored in a memory which relates to the proper tire inflation pressure(s) for a specific vehicle or tire. The vehicle type can be input using, for example, a manual input or the like. The stored data can be in the form of a simple look-up table. In addition to the tire pressures being based upon vehicle type, the specific type and manufacturer of a tire can also be used and data stored related to proper tire inflation.

In vehicles which include circuitry for monitoring tire pressures, and where the tire pressures must be different between the front and the back tires, the test system must be able to identify which pressure data came from which tire. In another aspect of the present invention, the tester 10 can communicate with circuitry in the vehicle to correlate where each of the pressure sensors are located. This is important, for example, if the tires are rotated. The communication to circuitry in the vehicle can be through, for example, an onboard data bus connection such as OBDII.

Various types of tire measurement instruments have been used. These include an electronic pressure gauge with a digital readout, a mechanical tread depth gauge, an electronic tread depth gauge, for example, using a laser. In one aspect, the present invention provides a combination mechanical tire pressure sensor and mechanical tire depth gauge, or a combination digital pressure sensor and mechanical depth gauge.

In one aspect, the present invention includes a combined tire pressure and tire temperature measurement test device, a combined electronic pressure and electronic tread depth gauge test device, or a combined temperature, pressure and depth gauge, any of which may or may not include the ability to print or wirelessly communicate. For example, such a tester can wirelessly communicate with a RF equipped battery tester, and/or can print wirelessly using, for example, an infrared communication link to a printer. The tire tester can include an air pressure sensor for coupling to a valve stem on a tire. Examples of electronic tread depth sensors include a spring-loaded shutter that selectively uncovers sequencing LED's or a light sensor detects which LED's are exposed and converts this information to depth. An infrared temperature sensor can be used to measure the side wall temperature of a tire which can then be used to properly interpret the tire pressure data.

In a configuration in which the tire tester includes a user output, instructions can be provided to step the operator through the various tires of the vehicle, for example, left front, right front, right rear and left rear. In another example, if user input is provided, the operator can provide an indication of which tire is being tested. A user input can also be used to initiate a particular test. Tests can be selected individually, or an automatic sequence can be initiated which steps an operator through the various tests. Collected data can be stored within the tire tester, or can be communicated remotely using wired or wireless communication techniques. The information can also be provided to a printer. Additionally, the data collected during the testing can be displayed and/or reviewed if the device includes a display. The collected data can also be stored in a non-volatile memory such as an EEPROM for later recovery. In order to conserve battery power, the system can be configured to automatically turn off after a period of non-use. In order to assist the operator, a light source can be coupled to the device for use in seeing various parts of the tire, for example the valve stem or tread. Units can be selectable, for example English, metric, PSI, kPa, inches and millimeters. In some configurations, the tire tester can wirelessly receive tire pressure data from imbedded pressure sensor carried in some modern vehicles.

Figure 5:
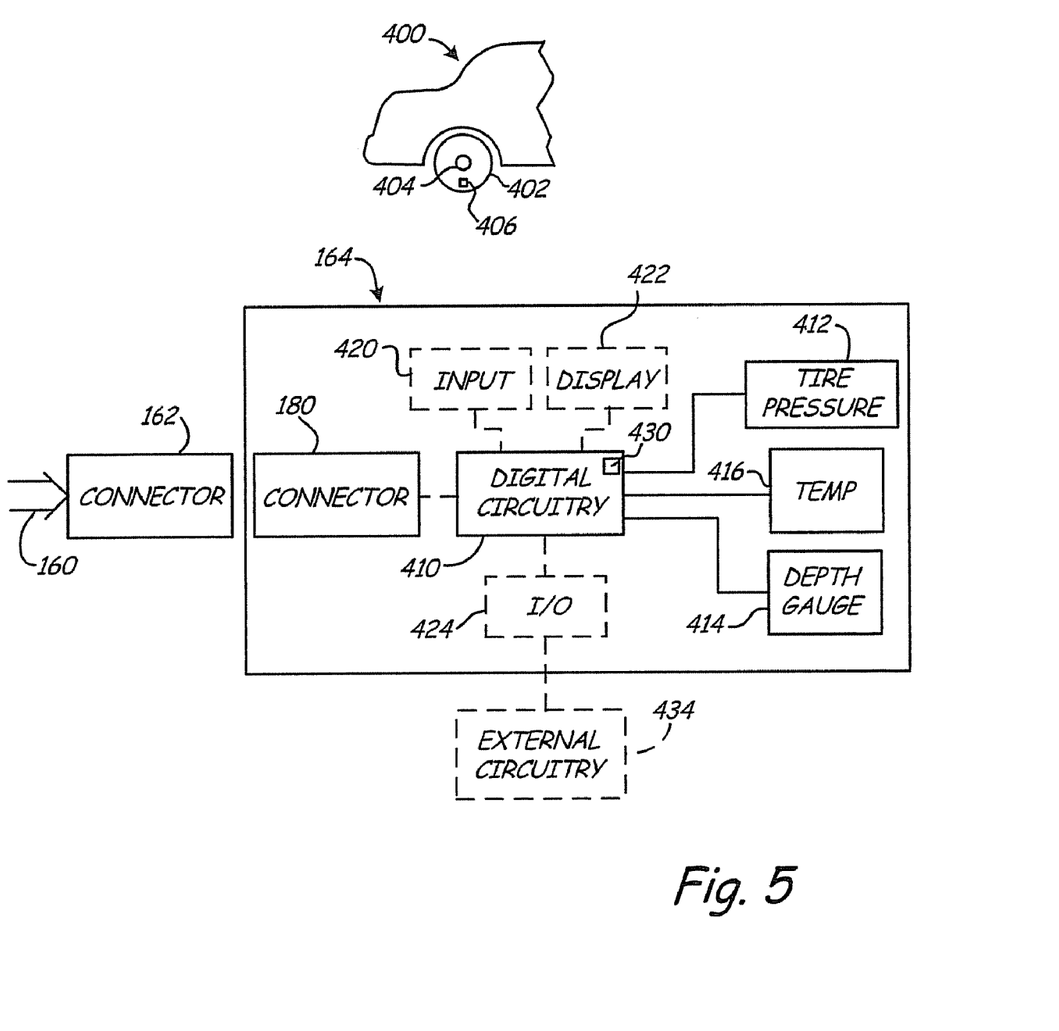
FIG. 5 is a diagram showing a module and an automotive vehicle.

FIG. 5 is a simplified diagram showing module 164 adjacent vehicle 400. Vehicle 400 includes one or more tires 402 which may include a valve 404 for filling tire with air. Tires 402 may also include internal pressure sensors 406 which can wirelessly transmit pressure information. Module 164 is configured for operation as discussed above and includes some type of digital circuitry 410 along with a tire pressure input 412 and/or a tread depth gauge input 414. Tire pressure input 412 and tread depth gauge input 414 can operate using any of the techniques discussed above and can comprise sensors which are directly coupling to tire 402, or can comprise inputs for receiving information either wired or wirelessly. Digital circuitry 410 can comprise any type of digital circuitry and may include a microprocessor or the like.

FIG. 5 also illustrates an optional input 420 and an optional display or other type of output 422. Input 420 can be, for example, a manual input such as a keypad, push button or the like and display 422 can be configured for displaying information locally to an operator. Input/output circuitry 424 is also shown as an option in FIG. 5 and can comprise, for example, circuitry for coupling to a communication network, wired or wireless communication circuitry, etc. The digital circuitry 410 can include memory 430 for containing program instructions for implementing software in accordance with the techniques discussed herein. Memory 430 can also be used for storing other types of information. The input/output circuitry 424 is illustrated as coupling to optional external circuitry 434 which can comprise, for example, other digital equipment including a printer for printing test results. In some configurations, module 164 receives power through connectors 162 and 180. In another example configuration, module 164 includes an internal power source such as a battery. Module 164 can also operate as a standalone device and does not require connection to an external battery tester. In such a configuration, connector 180 is not required. Module 164 also includes an optional temperature input 416 which can comprise, for example, a temperature sensor or an input for receiving temperature information.

Although the present invention has been described with reference to preferred embodiments, workers skilled in the art will recognize that changes may be made in form and detail without departing from the spirit and scope of the invention. In various configurations, module 164 includes no digital circuitry and tire pressure sensor 412 and depth gauge 414 are both mechanical devices. In another configuration, pressure sensor 412 is an electronic device and depth gauge 414 is a mechanical device.

What is claimed is:

1. An electronic battery tester for testing a storage battery comprising:
  a Kelvin connection configured to electrically couple to the storage battery;
  a microprocessor configured to determine a dynamic parameter of the storage battery;
  a data bus coupled to the microprocessor configured to carry data in the electronic battery tester;
  a connector coupled to the data bus and configured to communicate with a spaced apart digital module, the connector including electrical connections which couple to the data bus;
  a forcing function source configured to apply a forcing function signal to the storage battery through the Kelvin connection;
  a sensor electrically coupled to the storage battery and configured to sense an electrical response of the storage battery to the applied forcing function signal; and
  wherein the microprocessor is configured to couple to the spaced apart digital module and send or receive data from the spaced apart digital module on the data bus.

2. The apparatus of claim 1, wherein the data bus includes a serial connection.

3. The apparatus of claim 1, wherein the data bus includes electrical connections to first and second Kelvin connections.

4. The apparatus of claim 1, wherein the data bus includes a power supply connection.

5. The apparatus of claim 1, wherein the data bus includes a reset connection.

6. The apparatus of claim 1, wherein the data bus includes an analog voltage connection.

7. The apparatus of claim 1, wherein the data bus includes a bar code reader connection.

8. The apparatus of claim 1, wherein the data bus includes an infrared driver connection.

9. The apparatus of claim 1, wherein the data bus includes a frequency count connection.

10. The apparatus of claim 1, wherein the data bus includes an $I^2C$ connection.

11. The apparatus of claim 1, wherein the data bus includes an SPI connection.

12. The apparatus of claim 1, wherein the data bus includes a load control connection.

13. The apparatus of claim 1, wherein the microprocessor is configured to receive data from a vehicle through a connection to the spaced apart digital module.

14. The apparatus of claim 1, wherein the microprocessor is configured to send data to a printer on the data bus.

15. The apparatus of claim 1, wherein the microprocessor is configured to receive software from the spaced apart digital module through the data bus.

16. The apparatus of claim 1, wherein the microprocessor is configured to receive a software key from the spaced apart digital module through the data bus.

17. The apparatus of claim 1, wherein the microprocessor is configured to calibrate measurements by coupling to a calibrated reference to the spaced apart digital module.

18. The apparatus of claim 1 wherein the databus comprises a non-physical connection.

19. The apparatus of claim 18 wherein the non-physical connection comprises an RF connection.

20. The apparatus of claim 18 wherein the non-physical connection comprises an IR connection.

21. The apparatus of claim 1 wherein the connector comprises a wireless connector.

22. A spaced apart digital module configured to couple to the data bus through the connector of the battery tester of claim 1.

23. The apparatus of claim 22, wherein the spaced apart digital module includes a memory.

24. The apparatus of claim 22, wherein the spaced apart digital module includes test circuitry.

25. The apparatus of claim 22, wherein the spaced apart digital module includes a printer.

26. The apparatus of claim 22, wherein the spaced apart digital module is configured to couple to a printer.

27. The apparatus of claim 23, wherein the spaced apart digital memory includes software.

28. The apparatus of claim 23, wherein the spaced apart digital memory includes a software key.

29. The apparatus of claim 22, wherein the spaced apart digital module includes a calibrated reference.

30. The apparatus of claim 22, wherein the spaced apart digital module includes a resistive load.

31. The apparatus of claim 22 including a screw configured to attach the spaced apart digital module to the battery tester.

32. The apparatus of claim 22 including a latch configured to attach the spaced apart digital module to the battery tester.

33. The apparatus of claim 22 wherein the spaced apart digital module includes circuitry configured to scale a test measurement.

34. The apparatus of claim 18 wherein the spaced apart digital module is configured to couple to a 48 volt battery.

35. The apparatus of claim 18 wherein the spaced apart digital module includes a tire pressure sensor.

36. The apparatus of claim 18 wherein the spaced apart digital module includes a tire tread depth sensor.

37. The apparatus of claim 18 wherein the spaced apart digital module includes a brake pad wear sensor.

38. The apparatus of claim 18 wherein the spaced apart digital module includes a brake rotor wear sensor.

39. The apparatus of claim 18 wherein the spaced apart digital module includes an exhaust emission sensor.

40. The apparatus of claim 18 wherein the spaced apart digital module includes a bar code reader.

41. The apparatus of claim 18 wherein the spaced apart digital module includes an OBDII connector.

\* \* \* \* \*